US010966352B2

(12) United States Patent
Iyengar et al.

(10) Patent No.: US 10,966,352 B2
(45) Date of Patent: Mar. 30, 2021

(54) COOLING ELECTRONIC DEVICES IN A DATA CENTER

(71) Applicant: Google LLC, Mountain View, CA (US)

(72) Inventors: Madhusudan Krishnan Iyengar, Foster City, CA (US); Jorge Padilla, Union City, CA (US)

(73) Assignee: Google LLC, Mountain View, CA (US)

(*) Notice: Subject to any disclaimer, the term of this patent is extended or adjusted under 35 U.S.C. 154(b) by 0 days.

(21) Appl. No.: 16/139,377

(22) Filed: Sep. 24, 2018

(65) Prior Publication Data

US 2020/0100396 A1    Mar. 26, 2020

(51) Int. Cl.
*H05K 7/20* (2006.01)
*H01L 23/427* (2006.01)
*H01L 23/473* (2006.01)

(52) U.S. Cl.
CPC ....... *H05K 7/20772* (2013.01); *H01L 23/427* (2013.01); *H01L 23/473* (2013.01); *H05K 7/20254* (2013.01); *H05K 7/20336* (2013.01); *H05K 7/20509* (2013.01); *H05K 7/20518* (2013.01); *H05K 7/20727* (2013.01); *H05K 7/20781* (2013.01); *H05K 7/20809* (2013.01)

(58) Field of Classification Search
CPC ............. H05K 7/2029; H05K 7/20254; H05K 7/20309–20318; H05K 7/20772; H05K 7/20727; H05K 7/20781; G06F 2200/201; H01L 23/473; H01L 23/49568
USPC ................... 61/700; 361/699, 702, 708–711, 361/718–719, 679.47, 700; 165/80.4–80.5, 104.33; 257/713–714, 257/715, E23.088; 174/521, 526, 547, 174/548
See application file for complete search history.

(56) References Cited

U.S. PATENT DOCUMENTS

| | | | |
|---|---|---|---|
| 5,774,334 A | 6/1998 | Kawamura | |
| 6,292,365 B1 | 9/2001 | Ashiwake | |
| 6,317,326 B1 * | 11/2001 | Vogel | H01L 23/473 165/80.4 |
| 6,388,882 B1 | 5/2002 | Hoover et al. | |
| 6,952,346 B2 | 10/2005 | Tilton et al. | |
| 6,973,801 B1 | 12/2005 | Campbell et al. | |
| 7,086,247 B2 | 8/2006 | Campbell et al. | |

(Continued)

OTHER PUBLICATIONS

Alavi et al. "Fabrications of microchannels by laser machining and anisotropic," Sensor and Actuators A: Physical, vol. 32, Issues 1-3, Apr. 1992, 4 pages.

(Continued)

*Primary Examiner* — Robert J Hoffberg
*Assistant Examiner* — Amir A Jalali
(74) *Attorney, Agent, or Firm* — Fish & Richardson P.C.

(57) ABSTRACT

This disclosure describes a cooling system, for example, for rack mounted electronic devices (e.g., servers, processors, memory, networking devices or otherwise) in a data center. In various disclosed implementations, the cooling system may be or include a liquid cold plate assembly that is part of or integrated with a server tray package. In some implementations, the liquid cold plate assembly includes a base portion and a top portion that, in combination, form a cooling liquid flow path through which a cooling liquid is circulated and a thermal interface between one or more heat generating devices and the cooling liquid.

24 Claims, 13 Drawing Sheets

(56) References Cited

U.S. PATENT DOCUMENTS

| | | |
|---|---|---|
| 7,233,494 B2 | 6/2007 | Campbell et al. |
| 7,272,005 B2 | 9/2007 | Campbell et al. |
| 7,274,566 B2 | 9/2007 | Campbell et al. |
| 7,277,283 B2 | 10/2007 | Campbell et al. |
| 7,298,617 B2 | 11/2007 | Campbell et al. |
| 7,298,618 B2 | 11/2007 | Campbell et al. |
| 7,301,770 B2 | 11/2007 | Campbell et al. |
| 7,349,213 B2 | 3/2008 | Campbell et al. |
| 7,362,574 B2 | 4/2008 | Campbell et al. |
| 7,375,962 B2 | 5/2008 | Campbell et al. |
| 7,380,409 B2 | 6/2008 | Campbell et al. |
| 7,385,817 B2 | 6/2008 | Campbell et al. |
| 7,400,504 B2 | 7/2008 | Campbell et al. |
| 7,400,505 B2 | 7/2008 | Campbell et al. |
| 7,405,936 B1 | 7/2008 | Campbell et al. |
| 7,408,776 B2 | 8/2008 | Campbell et al. |
| 7,420,808 B2 | 9/2008 | Campbell et al. |
| 7,450,385 B1 | 11/2008 | Campbell et al. |
| 7,486,514 B2 | 2/2009 | Campbell et al. |
| 7,511,957 B2 | 3/2009 | Campbell et al. |
| 7,516,776 B2 | 4/2009 | Bezama et al. |
| 7,518,871 B2 | 4/2009 | Campbell et al. |
| 7,593,227 B2 | 9/2009 | Campbell et al. |
| 7,609,519 B2 | 10/2009 | Campbell et al. |
| 7,639,498 B2 | 12/2009 | Campbell et al. |
| 7,639,499 B1 | 12/2009 | Campbell et al. |
| 7,641,101 B2 | 1/2010 | Campbell et al. |
| 7,651,260 B2 | 1/2010 | Hamann et al. |
| 7,665,325 B2 | 3/2010 | Campbell et al. |
| 7,724,524 B1 | 5/2010 | Campbell et al. |
| 7,731,079 B2 | 6/2010 | Campbell et al. |
| 7,762,314 B2 | 7/2010 | Campbell et al. |
| 7,787,248 B2 | 8/2010 | Campbell et al. |
| 7,791,882 B2 | 9/2010 | Chu et al. |
| 7,796,389 B2 * | 9/2010 | Edmunds ............... H01L 23/427 165/104.14 |
| 7,808,781 B2 | 10/2010 | Colgan et al. |
| 7,830,664 B2 | 11/2010 | Campbell et al. |
| 7,841,385 B2 | 11/2010 | Campbell et al. |
| 7,885,074 B2 | 2/2011 | Campbell et al. |
| 7,905,096 B1 | 3/2011 | Campbell et al. |
| 7,907,406 B1 | 3/2011 | Campbell et al. |
| 7,916,483 B2 | 3/2011 | Campbell et al. |
| 7,948,757 B2 | 5/2011 | Campbell et al. |
| 7,963,119 B2 | 6/2011 | Campbell et al. |
| 7,965,509 B2 | 6/2011 | Campbell et al. |
| 7,967,062 B2 | 6/2011 | Campbell et al. |
| 7,978,472 B2 | 7/2011 | Campbell et al. |
| 7,978,473 B2 | 7/2011 | Campbell et al. |
| 7,990,709 B2 | 8/2011 | Campbell et al. |
| 7,992,627 B2 | 8/2011 | Bezama et al. |
| 8,014,150 B2 | 9/2011 | Campbell et al. |
| 8,018,720 B2 | 9/2011 | Campbell et al. |
| 8,027,162 B2 | 9/2011 | Campbell et al. |
| 8,029,186 B2 | 10/2011 | Hamann et al. |
| 8,038,343 B2 | 10/2011 | Hamann et al. |
| 8,051,897 B2 | 11/2011 | Campbell et al. |
| 8,056,615 B2 | 11/2011 | Downing |
| 8,059,405 B2 | 11/2011 | Campbell et al. |
| 8,077,462 B2 | 12/2011 | Barringer et al. |
| 8,094,453 B2 | 1/2012 | Campbell et al. |
| 8,144,467 B2 | 3/2012 | Campbell et al. |
| 8,179,674 B2 | 5/2012 | Carter et al. |
| 8,179,677 B2 | 5/2012 | Campbell et al. |
| 8,189,334 B2 | 5/2012 | Campbell et al. |
| 8,194,406 B2 | 6/2012 | Campbell et al. |
| 8,203,842 B2 | 6/2012 | Campbell et al. |
| 8,208,258 B2 | 6/2012 | Campbell et al. |
| 8,210,741 B2 | 7/2012 | Hamann et al. |
| 8,230,906 B2 | 7/2012 | Campbell et al. |
| 8,248,801 B2 | 8/2012 | Campbell et al. |
| 8,266,802 B2 | 9/2012 | Campbell et al. |
| 8,274,790 B2 | 9/2012 | Campbell et al. |
| 8,279,597 B2 | 10/2012 | El-Essawy et al. |
| 8,322,029 B2 | 12/2012 | Campbell et al. |
| 8,322,154 B2 | 12/2012 | Campbell et al. |
| 8,345,423 B2 | 1/2013 | Campbell et al. |
| 8,358,503 B2 | 1/2013 | Carter et al. |
| 8,369,091 B2 | 2/2013 | Campbell et al. |
| 8,387,249 B2 | 3/2013 | Campbell et al. |
| 8,437,129 B2 | 5/2013 | Tung |
| 8,472,182 B2 | 6/2013 | Campbell et al. |
| 8,490,679 B2 * | 7/2013 | Campbell ............... H05K 7/203 165/80.2 |
| 8,493,738 B2 | 7/2013 | Chainer et al. |
| 8,547,692 B2 | 10/2013 | El-Essawy et al. |
| 8,564,952 B2 | 10/2013 | Campbell et al. |
| 8,583,290 B2 | 11/2013 | Campbell et al. |
| 8,619,425 B2 | 12/2013 | Campbell et al. |
| 8,636,406 B2 | 1/2014 | Hamann et al. |
| 8,649,177 B2 | 2/2014 | Chainer et al. |
| 8,687,364 B2 | 4/2014 | Chainer et al. |
| 8,689,861 B2 | 4/2014 | Campbell et al. |
| 8,711,563 B2 | 4/2014 | Campbell et al. |
| 8,713,955 B2 | 5/2014 | Campbell et al. |
| 8,713,957 B2 | 5/2014 | Campbell et al. |
| 8,739,406 B2 | 6/2014 | Campbell et al. |
| 8,743,545 B2 | 6/2014 | Campbell et al. |
| 8,760,863 B2 | 6/2014 | Campbell et al. |
| 8,783,052 B2 | 7/2014 | Campbell et al. |
| 8,789,385 B2 | 7/2014 | Campbell et al. |
| 8,797,740 B2 | 8/2014 | Campbell et al. |
| 8,806,749 B2 | 8/2014 | Campbell et al. |
| 8,813,515 B2 | 8/2014 | Campbell et al. |
| 8,817,465 B2 | 8/2014 | Campbell et al. |
| 8,817,474 B2 | 8/2014 | Campbell et al. |
| 8,824,143 B2 | 9/2014 | Campbell et al. |
| 8,833,096 B2 | 9/2014 | Campbell et al. |
| 8,879,257 B2 | 11/2014 | Campbell et al. |
| 8,899,052 B2 | 12/2014 | Campbell et al. |
| 8,913,384 B2 | 12/2014 | David et al. |
| 8,922,998 B2 | 12/2014 | Campbell et al. |
| 8,925,333 B2 | 1/2015 | Campbell et al. |
| 8,929,080 B2 | 1/2015 | Campbell et al. |
| 8,934,250 B2 | 1/2015 | Campbell et al. |
| 8,941,994 B2 | 1/2015 | Campbell et al. |
| 8,947,873 B2 | 2/2015 | Campbell et al. |
| 8,953,317 B2 | 2/2015 | Campbell et al. |
| 8,955,346 B2 | 2/2015 | Campbell et al. |
| 8,964,390 B2 | 2/2015 | Campbell et al. |
| 8,964,391 B2 | 2/2015 | Campbell et al. |
| 8,966,922 B2 | 3/2015 | Campbell et al. |
| 8,985,847 B2 | 3/2015 | Campbell et al. |
| 9,009,968 B2 | 4/2015 | Campbell et al. |
| 9,009,971 B2 | 4/2015 | Campbell et al. |
| 9,013,872 B2 | 4/2015 | Campbell et al. |
| 9,027,360 B2 | 5/2015 | Chainer et al. |
| 9,038,406 B2 | 5/2015 | Campbell et al. |
| 9,043,035 B2 | 5/2015 | Chainer et al. |
| 9,045,995 B2 | 6/2015 | Graybill et al. |
| 9,052,722 B2 | 6/2015 | Chainer et al. |
| 9,078,379 B2 | 7/2015 | Campbell et al. |
| 9,095,889 B2 | 8/2015 | Campbell et al. |
| 9,095,942 B2 | 8/2015 | Campbell et al. |
| 9,101,078 B2 | 8/2015 | Campbell et al. |
| 9,110,476 B2 | 8/2015 | David et al. |
| 9,148,982 B2 | 9/2015 | Campbell et al. |
| 9,148,983 B2 | 9/2015 | Campbell et al. |
| 9,167,721 B2 | 10/2015 | Campbell et al. |
| 9,173,324 B2 | 10/2015 | Campbell et al. |
| 9,179,574 B2 | 11/2015 | Canney et al. |
| 9,185,830 B2 | 11/2015 | Chainer et al. |
| 9,200,851 B2 | 12/2015 | Campbell et al. |
| 9,207,002 B2 | 12/2015 | Campbell et al. |
| 9,210,830 B2 | 12/2015 | Campbell et al. |
| 9,213,343 B2 | 12/2015 | Campbell et al. |
| 9,218,008 B2 | 12/2015 | Campbell et al. |
| 9,250,024 B2 | 2/2016 | Campbell et al. |
| 9,253,921 B2 | 2/2016 | Campbell et al. |
| 9,261,308 B2 | 2/2016 | Campbell et al. |
| 9,282,675 B2 | 3/2016 | Campbell et al. |
| 9,282,678 B2 | 3/2016 | Campbell et al. |
| 9,285,050 B2 | 3/2016 | Campbell et al. |
| 9,288,932 B2 | 3/2016 | Campbell et al. |

(56) References Cited

U.S. PATENT DOCUMENTS

| | | | |
|---|---|---|---|
| 9,291,281 B2 | 3/2016 | Campbell et al. | |
| 9,295,181 B2 | 3/2016 | Campbell et al. | |
| 9,301,433 B2 | 3/2016 | Campbell et al. | |
| 9,303,926 B2 | 4/2016 | Campbell et al. | |
| 9,307,674 B2 | 4/2016 | Chainer et al. | |
| 9,313,920 B2 | 4/2016 | Campbell et al. | |
| 9,332,674 B2 | 5/2016 | Campbell et al. | |
| 9,338,924 B2 | 5/2016 | Campbell et al. | |
| 9,342,079 B2 | 5/2016 | David et al. | |
| 9,351,431 B2 | 5/2016 | Campbell et al. | |
| 9,357,674 B2 | 5/2016 | Campbell et al. | |
| 9,357,675 B2 | 5/2016 | Campbell et al. | |
| 9,357,682 B2 | 5/2016 | Campbell et al. | |
| 9,363,924 B2 | 6/2016 | Campbell et al. | |
| 9,386,727 B2 | 7/2016 | Barringer et al. | |
| 9,410,751 B2 | 8/2016 | David et al. | |
| 9,414,519 B2 | 8/2016 | Campbell et al. | |
| 9,414,523 B2 | 8/2016 | Chainer et al. | |
| 9,414,525 B2 | 8/2016 | Campbell et al. | |
| 9,439,325 B2 | 9/2016 | Campbell et al. | |
| 9,445,529 B2 | 9/2016 | Chainer et al. | |
| 9,460,985 B2 | 10/2016 | Joshi et al. | |
| 9,470,439 B2 | 10/2016 | Campbell et al. | |
| 9,474,186 B2 | 10/2016 | Campbell et al. | |
| 9,518,875 B2 | 12/2016 | Chainer et al. | |
| 9,655,282 B2 | 5/2017 | Barringer et al. | |
| 9,686,889 B2 | 6/2017 | Campbell et al. | |
| 9,719,865 B2 | 8/2017 | Chainer et al. | |
| 9,750,159 B2 | 8/2017 | Campbell et al. | |
| 9,763,357 B2 | 9/2017 | Campbell et al. | |
| 9,831,151 B1* | 11/2017 | Schultz | H01L 23/42 |
| 9,879,926 B2 | 1/2018 | David et al. | |
| 2003/0147214 A1 | 8/2003 | Patel et al. | |
| 2004/0061218 A1* | 4/2004 | Tilton | F28D 5/00 |
| | | | 257/710 |
| 2007/0023879 A1 | 2/2007 | Pandey et al. | |
| 2007/0121295 A1 | 5/2007 | Campbell et al. | |
| 2007/0125523 A1 | 6/2007 | Bhatti et al. | |
| 2009/0140417 A1* | 6/2009 | Refai-Ahmed | H01L 23/3732 |
| | | | 257/707 |
| 2009/0218078 A1* | 9/2009 | Brunschwiler | G06F 1/20 |
| | | | 165/104.33 |
| 2010/0252234 A1 | 10/2010 | Cambell | |
| 2011/0240281 A1 | 10/2011 | Avery | |
| 2013/0027878 A1* | 1/2013 | Campbell | H05K 7/2029 |
| | | | 361/694 |
| 2013/0027884 A1 | 1/2013 | Campbell et al. | |
| 2014/0015106 A1* | 1/2014 | Hsieh | H01L 23/562 |
| | | | 257/618 |
| 2014/0085817 A1 | 3/2014 | Campbell et al. | |
| 2014/0146467 A1 | 5/2014 | Campbell | |
| 2015/0319883 A1 | 11/2015 | Branton | |
| 2016/0262288 A1 | 9/2016 | Chainer et al. | |
| 2016/0338226 A1 | 11/2016 | Sakamoto et al. | |
| 2017/0127565 A1 | 5/2017 | Campbell | |
| 2018/0005921 A1 | 1/2018 | Takemura et al. | |
| 2018/0090417 A1 | 3/2018 | Gutala | |
| 2018/0211900 A1 | 7/2018 | Gutala | |
| 2019/0103290 A1* | 4/2019 | Medina | H01L 21/4882 |
| 2019/0206764 A1* | 7/2019 | Kulkarni | H01L 23/433 |
| 2019/0353430 A1* | 11/2019 | Narasimhan | H05K 7/2039 |
| 2020/0025641 A1* | 1/2020 | Long | G01M 3/16 |
| 2020/0029466 A1* | 1/2020 | Long | H05K 7/20254 |
| 2020/0296862 A1 | 9/2020 | Iyengar et al. | |

OTHER PUBLICATIONS

PCT International Search Report and Written Opinion in International Application No. PCT/US2019/028109, dated Jun. 28, 2019, 16 pages.

PCT International Search Report and Written Opinion in International Application No. PCT/US2019/027909, dated Aug. 13, 2019, 14 pages.

PCT International Search Report and Written Opinion in International Application No. PCT/US2019/046794, dated Nov. 15, 2019, 15 pages.

PCT International Preliminary Report on Patentability in International Application No. PCT/US2019/027909, dated Oct. 20, 2020, 9 pages.

TW OA in Taiwan Application No. 108111850, dated Aug. 25, 2020, 18 pages (with English translation).

* cited by examiner

US 10,966,352 B2

COOLING ELECTRONIC DEVICES IN A DATA CENTER

TECHNICAL FIELD

This document relates to systems and methods for providing cooling to electronic equipment, such as computer server racks and related equipment in computer data centers, with a cold plate.

BACKGROUND

Computer users often focus on the speed of computer microprocessors (e.g., megahertz and gigahertz). Many forget that this speed often comes with a cost—higher power consumption. This power consumption also generates heat. That is because, by simple laws of physics, all the power has to go somewhere, and that somewhere is, in the end, conversion into heat. A pair of microprocessors mounted on a single motherboard can draw hundreds of watts or more of power. Multiply that figure by several thousand (or tens of thousands) to account for the many computers in a large data center, and one can readily appreciate the amount of heat that can be generated. The effects of power consumed by the critical load in the data center are often compounded when one incorporates all of the ancillary equipment required to support the critical load.

Many techniques may be used to cool electronic devices (e.g., processors, memories, networking devices, and other heat generating devices) that are located on a server or network rack tray. For instance, forced convection may be created by providing a cooling airflow over the devices. Fans located near the devices, fans located in computer server rooms, and/or fans located in ductwork in fluid communication with the air surrounding the electronic devices, may force the cooling airflow over the tray containing the devices. In some instances, one or more components or devices on a server tray may be located in a difficult-to-cool area of the tray; for example, an area where forced convection is not particularly effective or not available.

The consequence of inadequate and/or insufficient cooling may be the failure of one or more electronic devices on the tray due to a temperature of the device exceeding a maximum rated temperature. While certain redundancies may be built into a computer data center, a server rack, and even individual trays, the failure of devices due to overheating can come at a great cost in terms of speed, efficiency, and expense.

SUMMARY

This disclosure describes a cooling system, for example, for rack mounted electronic devices (e.g., servers, processors, memory, networking devices or otherwise) in a data center. In various disclosed implementations, the cooling system may be or include a liquid cold plate assembly that is part of or integrated with a server tray package. In some implementations, the liquid cold plate assembly includes a base portion and a top portion that, in combination, form a cooling liquid flow path through which a cooling liquid is circulated and a thermal interface between one or more heat generating devices and the cooling liquid.

In an example implementation, a server tray package includes a motherboard assembly that includes a plurality of data center electronic devices, the plurality of data center electronic devices including at least one heat generating processor device; a liquid cold plate assembly that includes a base portion mounted to the motherboard assembly, the base portion and motherboard assembly defining a volume that at least partially encloses the plurality of data center electronic devices, and a top portion mounted to the base portion and including a heat transfer member that includes an inlet port and an outlet port that are in fluid communication with a cooling liquid flow path defined through the heat transfer member; and a vapor chamber positioned between the base portion and the top portion, the vapor chamber including a housing that encloses a heat transfer fluid in thermal contact with the motherboard assembly and the liquid cold plate assembly.

An aspect combinable with the example implementation further includes a first thermal interface material positioned between a bottom surface of the top portion and the vapor chamber.

Another aspect combinable with any of the previous aspects further includes a second thermal interface material positioned between a top surface of the base portion and at least a portion of the plurality of data center electronic devices.

Another aspect combinable with any of the previous aspects further includes a third thermal interface material positioned between the top surface of the base portion and the vapor chamber.

In another aspect combinable with any of the previous aspects, the liquid cold plate assembly further includes a plurality of heat transfer surfaces enclosed within the cooling liquid flow path.

In another aspect combinable with any of the previous aspects, the vapor chamber includes a plurality of fluidly independent chambers within the housing, each of the fluidly independent chambers enclosing at least a portion of the heat transfer fluid.

In another aspect combinable with any of the previous aspects, the portions of the heat transfer fluid vary in at least one of composition or amount.

In another aspect combinable with any of the previous aspects, at least one of the fluidly independent chambers includes a first volume, and at least another of the fluidly independent chambers includes a second volume greater than the first volume.

In another aspect combinable with any of the previous aspects, the second volume is positioned in vertical alignment above the heat generating processor device.

In another aspect combinable with any of the previous aspects, the vapor chamber is integrally formed as a base of the top portion of the liquid cold plate assembly, and the vapor chamber is positioned on top of a cap of the base portion and in conductive heat transfer contact with the cap through a thermal interface material.

In another aspect combinable with any of the previous aspects, the vapor chamber is integrally formed as a cap of the base portion of the liquid cold plate assembly, and the vapor chamber supports a base of the top portion and is in conductive heat transfer contact with the base through a thermal interface material.

In another example implementation, a method for cooling heat generating devices in a data center includes circulating a flow of a cooling liquid to a server tray package that includes a motherboard assembly that includes a plurality of data center electronic devices, the plurality of data center electronic devices including at least one heat generating processor device, a liquid cold plate assembly that includes a base portion mounted to the motherboard assembly, the base portion and motherboard assembly defining a volume that at least partially encloses the plurality of data center electronic devices, and a top portion mounted to the base portion, and a vapor chamber positioned between the base portion and the top portion; circulating a flow of a cooling liquid into an inlet port of the heat transfer member; receiving heat from the plurality of data center electronic devices into a heat transfer fluid enclosed within a housing of the vapor chamber to vaporize at least a portion of the heat transfer fluid; circulating the flow of the cooling liquid from the inlet port through a cooling liquid flow path defined through the heat transfer member to transfer heat from the vaporized portion of the heat transfer fluid into the cooling liquid; and circulating the heated flow of the cooling liquid from the cooling liquid flow path to an outlet port of the heat transfer member.

An aspect combinable with the example implementation further includes transferring the heat from the plurality of data center electronic devices through a first thermal interface material positioned between the plurality of data center electronic devices and a top surface of the base portion.

Another aspect combinable with any of the previous aspects further includes transferring the heat from the top surface of the base portion through a second thermal interface material positioned between the base portion and the vapor chamber.

Another aspect combinable with any of the previous aspects further includes transferring the heat from the vapor chamber through a third thermal interface material positioned between a bottom surface of the top portion of the liquid cold plate assembly and the vapor chamber.

In another aspect combinable with any of the previous aspects, circulating the flow of the cooling liquid through the cooling liquid flow path defined through the heat transfer member includes circulating the cooling liquid through a plurality of flow channels defined by a plurality of heat transfer surfaces enclosed within the cooling liquid flow path.

In another aspect combinable with any of the previous aspects, receiving heat from the plurality of data center electronic devices into the heat transfer fluid enclosed within the housing of the vapor chamber to vaporize at least the portion of the heat transfer fluid includes receiving heat from the plurality of data center electronic devices into a plurality of portions of the heat transfer fluid enclosed within respective fluidly independent chambers within the housing of the vapor chamber.

In another aspect combinable with any of the previous aspects, the portions of the heat transfer fluid vary in at least one of composition or amount.

In another aspect combinable with any of the previous aspects, at least one of the fluidly independent chambers includes a first volume.

In another aspect combinable with any of the previous aspects, at least another of the fluidly independent chambers includes a second volume greater than the first volume.

Another aspect combinable with any of the previous aspects further includes receiving heat from the heat generating processor device into the portion of the heat transfer fluid enclosed within the second volume in the another of the fluidly independent chambers.

Another aspect combinable with any of the previous aspects further includes receiving heat from one or more memory devices into the portion of the heat transfer fluid enclosed within the first volume in the at least one of the fluidly independent chambers.

In another aspect combinable with any of the previous aspects, the vapor chamber is integrally formed as a base of the top portion of the liquid cold plate assembly, and the vapor chamber is positioned on top of a cap of the base portion and in conductive heat transfer contact with the cap through a thermal interface material.

In another aspect combinable with any of the previous aspects, the vapor chamber is integrally formed as a cap of the base portion of the liquid cold plate assembly, and the vapor chamber supports a base of the top portion and is in conductive heat transfer contact with the base through a thermal interface material.

In another example implementation, a method for forming a server tray package includes mounting a plurality of data center electronic devices to a motherboard assembly the plurality of data center electronic devices including at least one heat generating processor device; mounting a liquid cold plate assembly base to the motherboard assembly to at least partially define a volume that encloses the plurality of data center electronic devices; mounting a vapor chamber to the liquid cold plate assembly base, the vapor chamber including a housing that defines at least one fluidly isolated chamber that encloses at least a portion of a phase change fluid; and mounting a liquid cold plate assembly top hat to the vapor chamber, the liquid cold plate assembly top hat including a heat transfer member that includes an inlet port and an outlet port that are in fluid communication with a cooling liquid flow path defined through the heat transfer member.

An aspect combinable with the example implementation further includes mounting the plurality of data center electronic devices to an interposer of the motherboard assembly.

Another aspect combinable with any of the previous aspects further includes mounting the interposer to a substrate of the motherboard assembly.

Another aspect combinable with any of the previous aspects further includes mounting the substrate to a motherboard of the motherboard assembly.

Another aspect combinable with any of the previous aspects further includes positioning a first thermal interface material between a lid of the liquid cold plate assembly base and the vapor chamber.

Another aspect combinable with any of the previous aspects further includes positioning a second thermal interface material between the lid and the plurality of data center electronic devices.

Another aspect combinable with any of the previous aspects further includes positioning a third thermal interface material between the vapor chamber and a base of the liquid cold plate assembly top hat.

In another aspect combinable with any of the previous aspects, the vapor chamber includes a base of the liquid cold plate assembly top hat.

In another aspect combinable with any of the previous aspects, the vapor chamber includes a lid of the liquid cold plate assembly base.

In another aspect combinable with any of the previous aspects, an area of a bottom surface of the housing of the vapor chamber is different than an area of the liquid cold plate assembly base upon which the vapor chamber is mounted.

Various implementations of a data center cooling system according to the present disclosure may include one, some, or all of the following features. For example, a server tray package according to the present disclosure may provide for direct liquid cooling to high heat generating electronic devices in a data center. As another example, a server tray package according to the present disclosure may provide for multiple functionality including cooling, mechanical rigidity, and liquid coolant sealing. As another example, a server tray package according to the present disclosure may provide for custom cooling liquid flow paths and flow geometries to cool both high and low heat generating electronic devices mounted on a single substrate. As yet another example, a server tray package according to the present disclosure may allow for the cooling of heat-generating devices mounted on a substrate that have different heights (and different power usages). As a further example, a server tray package according to the present disclosure may allow for hot spot spreading in combination with high performance liquid cooling via cold plates. As yet another example, a server tray package according to the present disclosure may include one or more vapor chambers that can be tuned for cooling individual heat sources based on temperature and power requirements. As another example, a server tray package according to the present disclosure may allow for higher power computing components (e.g., processors) to be cooled by direct conductive contact with a liquid cooled cold plate for better performance. As a further example, a server tray package according to the present disclosure may include a partial lid with an aperture to allow for the integration of a liquid cooled cold plate with less potential warpage, but with protection for the server package electronic devices. As yet another example, a server tray package according to the present disclosure may include a partial lid which provides a seating surface for the liquid cooled cold plate and prevent tilt of the plate. As another example, a server tray package according to the present disclosure may provide for more direct heat transfer through conductive contact between a heat generating device (such as a processor) while still providing cooling to devices that generate less heat, such as memory modules.

The details of one or more embodiments are set forth in the accompanying drawings and the description below. Other features, objects, and advantages will be apparent from the description and drawings, and from the claims.

DETAILED DESCRIPTION

In some example implementations, a cooling system, for example, for rack mounted electronic devices (e.g., servers, processors, memory, networking devices or otherwise) in a data center is disclosed. In various disclosed implementations, the cooling system may be or include a liquid cold plate assembly that is part of or integrated with a server tray package. In some implementations, the liquid cold plate assembly includes a base portion and a top portion that, in combination, form a cooling liquid flow path through which a cooling liquid is circulated and a thermal interface between one or more heat generating devices and the cooling liquid.

Figure 1:
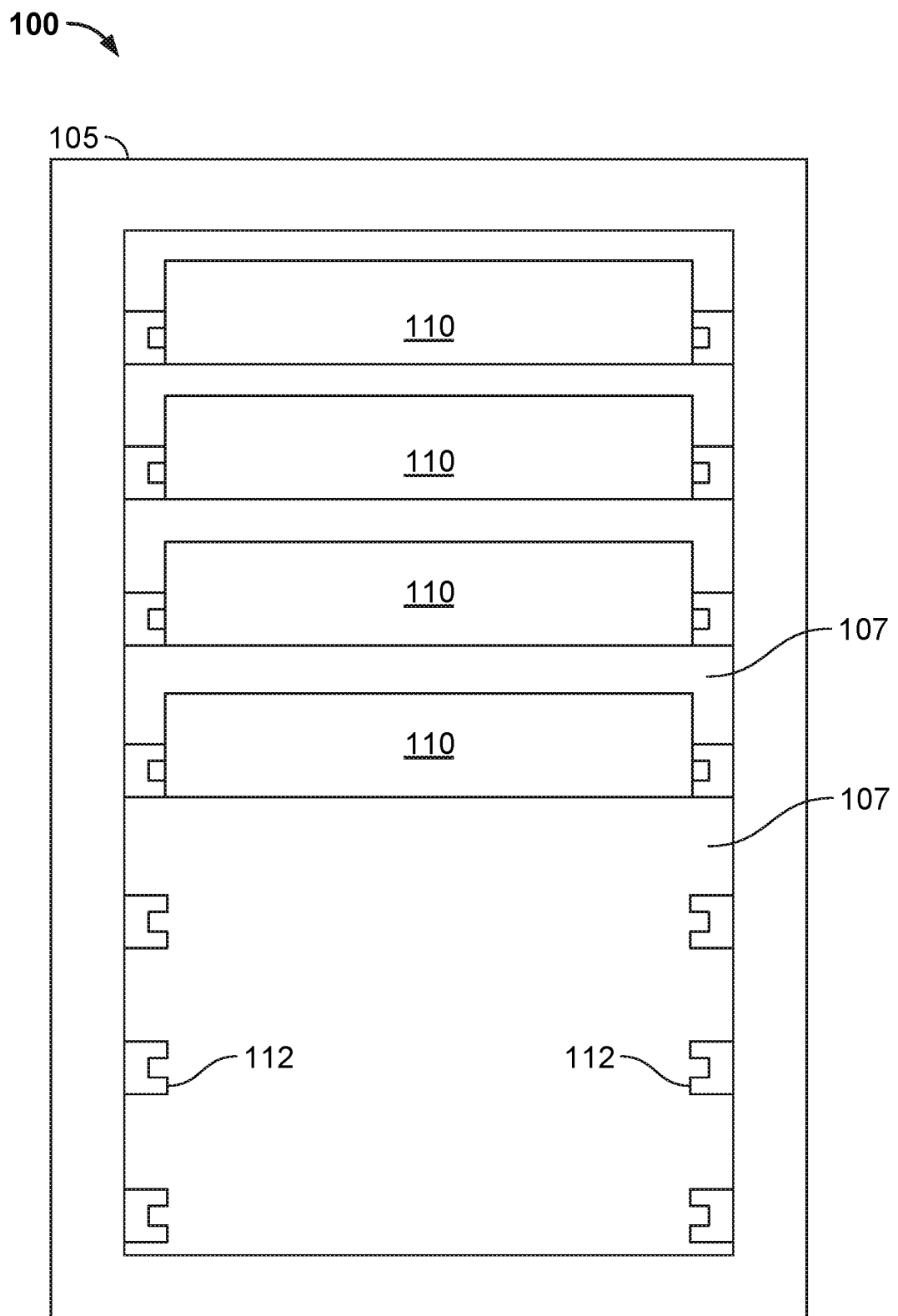
FIG. 1 illustrates a front view of a server rack and server rack sub-assemblies configured to mount within a rack used in a data center environment.

FIG. 1 illustrates an example system 100 that includes a server rack 105, e.g., a 13 inch or 19 inch server rack, and multiple server rack sub-assemblies 110 mounted within the rack 105. Although a single server rack 105 is illustrated, server rack 105 may be one of a number of server racks within the system 100, which may include a server farm or a co-location facility that contains various rack mounted computer systems. Also, although multiple server rack sub-assemblies 110 are illustrated as mounted within the rack 105, there might be only a single server rack sub-assembly. Generally, the server rack 105 defines multiple slots 107 that are arranged in an orderly and repeating fashion within the server rack 105, and each slot 107 is a space in the rack into which a corresponding server rack sub-assembly 110 can be placed and removed. For example, the server rack sub-assembly can be supported on rails 112 that project from opposite sides of the rack 105, and which can define the position of the slots 107.

The slots 107, and the server rack sub-assemblies 110, can be oriented with the illustrated horizontal arrangement (with respect to gravity). Alternatively, the slots 107, and the server rack sub-assemblies 110, can be oriented vertically (with respect to gravity). Where the slots are oriented horizontally, they may be stacked vertically in the rack 105, and where the slots are oriented vertically, they may be stacked horizontally in the rack 105.

Server rack 105, as part of a larger data center for instance, may provide data processing and storage capacity. In operation, a data center may be connected to a network, and may receive and respond to various requests from the network to retrieve, process, and/or store data. In operation, for example, the server rack 105 typically facilitates the communication of information over a network with user interfaces generated by web browser applications of users who request services provided by applications running on computers in the datacenter. For example, the server rack 105 may provide or help provide a user who is using a web browser to access web sites on the Internet or the World Wide Web.

The server rack sub-assembly 110 may be one of a variety of structures that can be mounted in a server rack. For example, in some implementations, the server rack sub-assembly 110 may be a "tray" or tray assembly that can be slidably inserted into the server rack 105. The term "tray" is not limited to any particular arrangement, but instead applies to the motherboard or other relatively flat structures appurtenant to a motherboard for supporting the motherboard in position in a rack structure. In some implementations, the server rack sub-assembly 110 may be a server tray package, server chassis, or server container (e.g., server box). In some implementations, the server rack sub-assembly 110 may be a hard drive cage.

Figure 2:
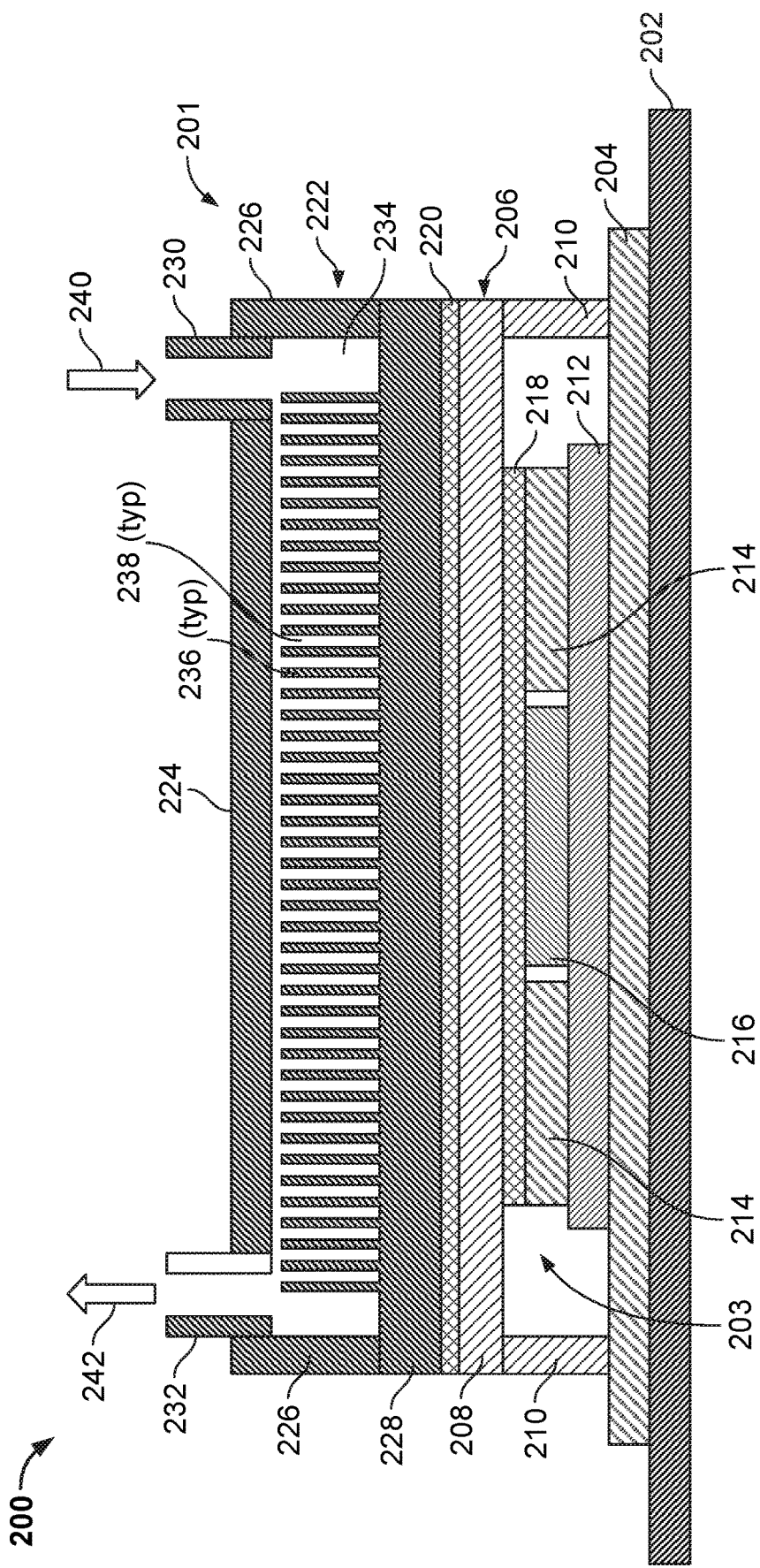
FIG. 2 illustrates a schematic cross-sectional side view of an example implementation of a server tray package that includes a liquid cold plate assembly.

FIG. 2 illustrates a schematic cross-sectional side view of an example implementation of a server tray package 200 that includes a liquid cold plate assembly 201. In some implementations, the server tray package 200 may be used as one or more of the server rack sub-assemblies 110 shown in FIG. 1. Referring to FIG. 2, the server tray package 200 includes a printed circuit board 202, e.g., motherboard 202, that supports one or more data center electronic devices; in this example, two or more memory modules 214 and one or more processing devices 216 (e.g., one or more application-specific integrated circuits (ASIC)). In some aspects, the motherboard 202 may be mounted on a frame (not shown), which can include or simply be a flat structure that can be grasped by technicians for moving the motherboard 202 into place and holding it in position within the rack 105. For example, the server tray package 200 may be mounted horizontally in the server rack 105 such as by sliding the frame into the slot 107 and over a pair of rails in the rack 105 on opposed sides of the server tray package 200—much like sliding a lunch tray into a cafeteria rack. The frame can extend below the motherboard 202 or can have other forms (e.g., by implementing it as a peripheral frame around the motherboard 202) or may be eliminated so that the motherboard itself is located in, e.g., slidably engages, the rack 105. The frame can be a flat plate or include one or more side walls that project upwardly from the edges of the flat plate, and the flat plate could be the floor of a closed-top or open-top box or cage.

In some examples, one motherboard 202 is mounted on a frame; alternatively, multiple motherboards 202 may be mounted on a frame, depending on the needs of the particular application. In some implementations, the one or more fans (not shown) can be placed on the motherboard 202 or a frame so that air enters at the front edge of the server tray package 200, closer to the front of the rack 105 when the server tray package 200 is installed in the rack 105, flows over the motherboard 202, over some of the data center electronic components on the motherboard 202, and is exhausted from the server tray package 200 at the back edge, closer to the back of the rack 105 when the server tray package 200 is installed in the rack 105. The one or more fans can be secured to the motherboard 202 or a frame by brackets.

As illustrated, a substrate 204 and an interposer 212 (e.g., a silicon interposer) are positioned between the data center electronic devices 214 and 216 and the motherboard 202. The substrate 204, for example, provides an interface between one or more of the data center electronic devices (e.g., the processing device 216) and the motherboard 202, such as through pins that provide electrical and communication interfaces. The substrate 204 also, in this example, may provide a mounting location for one or more components of the liquid cold plate assembly 201. The interposer 212, for example, provides a high bandwidth connection between the data center electronic devices, such as between the memory modules 214 and the processing device 216.

As shown in FIG. 2, the liquid cold plate assembly 201 includes a top portion 222, also referred to as a top hat 222, and a base portion 206. The base portion 206 includes a lid 208 that defines a top surface of the base portion 206 and sides 216 that couple the lid 208 to the substrate 204. In combination, the lid 208 and the sides 210 define or enclose a volume 203 in which the interposer 212 and the data center electronic devices 214 and 216 (mounted thereon) are positioned in the server tray package 200. As shown in this example, a thermal interface material 218 (e.g., a phase change material or otherwise thermally conductive material) is contactingly positioned between a bottom side of the lid 208 and the data center electronic devices 214 and 216 to provide a conductive heat transfer interface between these components.

In this example implementation, the top hat 222 is mounted to a top surface of the lid 208 through another thermal interface material 220 (e.g., a phase change material or otherwise thermally conductive material) that provides a conductive heat transfer interface between a bottom 228 of the top hat 222 and the lid 208 of the base portion 206. The top hat 222, as shown, includes a cap 224 that is connected to the bottom 228 through sides 226. In combination, the cap 224, sides 226, and bottom 228 define a volume 234 through which a flow of a cooling liquid may be circulated.

As shown in this example, the cap 224 includes a cooling liquid inlet 230 through which a supply 240 of cooling liquid may enter. The cap 224 also includes a cooling liquid outlet 232 through which a return 242 of cooling liquid may exit. The volume 234 defines or includes a cooling liquid flow path between the inlet 230 and the outlet 232. As shown in this example, one or more heat transfer surfaces 236 (e.g., fins, undulations, ridges, or other extended surfaces that increase a heat transfer area) are positioned in the volume 234. The heat transfer surfaces 236 define channels 238, for example, through which the cooling liquid may be circulated to increase an amount of heat transferred from the data center electronic devices 214 and 216 to the cooling liquid (e.g., relative to an amount transferred in an implementation of the server tray package 200 that does not include the heat transfer surfaces 236). Alternative implementations of the server tray package 200 may include multiple inlets 230, multiple outlets 232, or may not include the heat transfer surfaces 236.

In an example operation of the server tray package 200 to cool the data center electronic devices 214 and 216, the server tray package 200 may be deployed, for example, in a data center server rack 105 in a data center. During operation of the server tray package 200, the processing device 216 and memory modules 214 generate heat that may need to be dissipated or removed from the server tray package 200 (e.g., for proper operation of the server tray package 200). Heat generated by the processing device 216 and memory modules 214 is transferred through the thermal interface material 218 and to the lid 208 of the base portion 206 of the liquid cold plate assembly 201. The transferred heat is further transferred from the lid 208, through the thermal interface material 220, and to the bottom 228 of the top hat 222. In some examples, one or more components of the liquid cold plate assembly 201 may be formed or made from a thermally conductive material, such as copper, aluminum, a combination of copper and aluminum, or other thermally conductive materials.

The heat transferred to the bottom 228 of the top hat 222 is then transferred to the supply 240 of the cooling liquid that is circulated through the inlet 230 and into the volume 234 of the top hat 222. In some examples, the cooling liquid may be a chilled water or glycol, such as from one or more chillers fluidly coupled to the server tray package 200. In alternative examples, the cooling liquid may be a condenser water or other evaporatively-cooled liquid (e.g., without mechanical refrigeration). In other examples, the cooling liquid may be a dielectric single or two-phase fluid. In any event, the cooling liquid supply 240 may be at an appropriate temperature and flow rate to remove a desired amount of heat from the data center electronic devices 214 and 216.

In some examples, heat is transferred directly from the bottom 228 to the cooling liquid supply 240. Heat may also be transferred from the bottom 228, through one or more heat transfer surfaces 236, and then to the cooling liquid supply 240 that flows through channels 238. The heated cooling liquid supply 240 is circulated to the outlet 232 and exits the top hat 222 as the cooling liquid return 242 (e.g., that is at a higher temperature than the cooling liquid supply 240). The cooling liquid return 242 is circulated back, e.g., to a source of the cooling liquid, to expel the heat (e.g., in a chiller, cooling tower, or other heat exchanger) from the return 242.

Figures 3A, 3B:
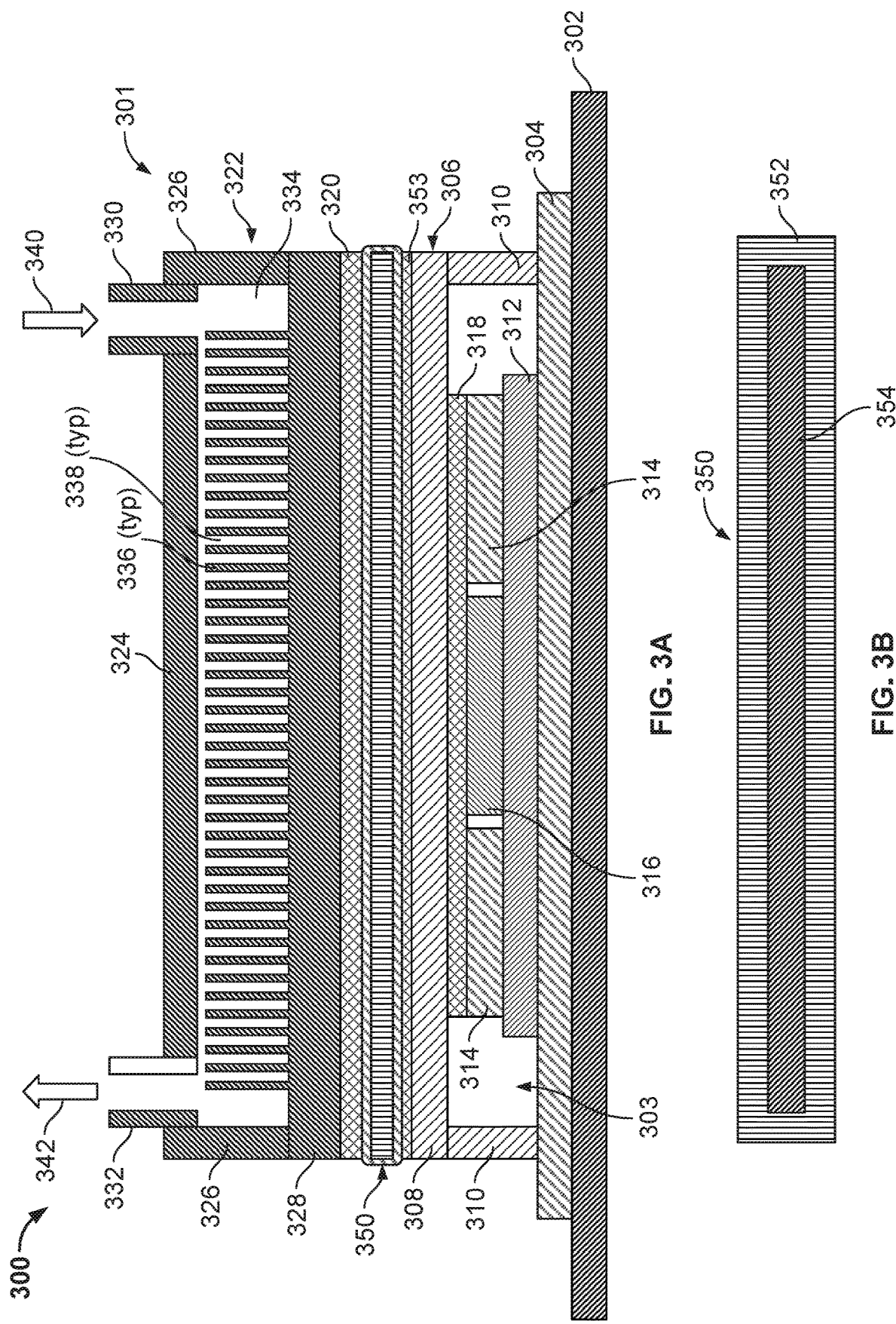
FIG. 3A illustrates a schematic cross-sectional side view of another example implementation of a server tray package that includes a liquid cold plate assembly and a vapor chamber.
FIG. 3B illustrates a schematic cross-sectional side view of an example implementation of a vapor chamber that can be used in a liquid cold plate assembly in a server tray package.

FIG. 3A illustrates a schematic cross-sectional side view of another example implementation of a server tray package 300 that includes a liquid cold plate assembly 301 and a vapor chamber 350. In some implementations, the server tray package 300 may be used as one or more of the server rack sub-assemblies 110 shown in FIG. 1. Referring to FIG. 3A, the server tray package 300 includes a printed circuit board 302, e.g., motherboard 302, that supports one or more data center electronic devices; in this example, two or more memory modules 314 and one or more processing devices 316 (e.g., one or more application-specific integrated circuits (ASIC)). In some aspects, the motherboard 302 may be mounted on a frame (not shown), which can include or simply be a flat structure that can be grasped by technicians for moving the motherboard 302 into place and holding it in position within the rack 105. For example, the server tray package 300 may be mounted horizontally in the server rack 105 such as by sliding the frame into the slot 107 and over a pair of rails in the rack 105 on opposed sides of the server tray package 300—much like sliding a lunch tray into a cafeteria rack. The frame can extend below the motherboard 302 or can have other forms (e.g., by implementing it as a peripheral frame around the motherboard 302) or may be eliminated so that the motherboard itself is located in, e.g., slidably engages, the rack 105. The frame can be a flat plate or include one or more side walls that project upwardly from the edges of the flat plate, and the flat plate could be the floor of a closed-top or open-top box or cage.

In some examples, one motherboard 302 is mounted on a frame; alternatively, multiple motherboards 302 may be mounted on a frame, depending on the needs of the particular application. In some implementations, the one or more fans (not shown) can be placed on the motherboard 302 or a frame so that air enters at the front edge of the server tray package 300, closer to the front of the rack 105 when the server tray package 300 is installed in the rack 105, flows over the motherboard 302, over some of the data center electronic components on the motherboard 302, and is exhausted from the server tray package 300 at the back edge, closer to the back of the rack 105 when the server tray package 300 is installed in the rack 105. The one or more fans can be secured to the motherboard 302 or a frame by brackets.

As illustrated, a substrate 304 and an interposer 312 (e.g., a silicon interposer) are positioned between the data center electronic devices 314 and 316 and the motherboard 302. The substrate 304, for example, provides an interface between one or more of the data center electronic devices (e.g., the processing device 316) and the motherboard 302, such as through pins that provide electrical and communication interfaces. The substrate 304 also, in this example, may provide a mounting location for one or more components of the liquid cold plate assembly 301. The interposer 312, for example, provides a high bandwidth connection between the data center electronic devices, such as between the memory modules 314 and the processing device 316.

As shown in FIG. 3A, the liquid cold plate assembly 301 includes a top portion 322, also referred to as a top hat 322, and a base portion 306. The base portion 306 includes a lid 308 that defines a top surface of the base portion 306 and sides 310 that couple the lid 308 to the substrate 304. In combination, the lid 308 and the sides 310 define or enclose a volume 303 in which the interposer 312 and the data center electronic devices 314 and 316 (mounted thereon) are positioned in the server tray package 300. As shown in this example, a thermal interface material 318 (e.g., a phase change material or otherwise thermally conductive material) is contactingly positioned between a bottom side of the lid 308 and the data center electronic devices 314 and 316 to provide a conductive heat transfer interface between these components.

In this example implementation, the top hat 322 is mounted to a vapor chamber 350 through another thermal interface material 320 (e.g., a phase change material or otherwise thermally conductive material) that provides a conductive heat transfer interface between a bottom 328 of the top hat 322 and the vapor chamber 350. Turning briefly to FIG. 3B, this figure illustrates a schematic cross-sectional side view of an example implementation of the vapor chamber 350. As shown, the vapor chamber 350 includes a housing that contains a heat transfer fluid 354 (e.g., water, refrigerant, or other fluid that boils in response to heat being received). In this example, the vapor chamber 350 includes a single chamber within the housing 352 that encloses the fluid 354. In some aspects, the vapor chamber 350 may include boiling enhancements (e.g., fins or otherwise) within the chamber (e.g., on a bottom inner surface) to increase heat transfer to the fluid 354. The vapor chamber 350 may also include condensing enhancements (e.g., a wicking structure) within the chamber (e.g., on a top inner surface) to allow for better heat transfer from the fluid 354 to the bottom 328 of the top hat 322.

As shown in this example, the vapor chamber 350 (with a single chamber and fluid 354) sits on top of the data center electronic devices 314 and 316. In some aspects, one or more of the electronic devices (e.g., processor 316) may generate more heat than the other electronic devices (e.g., memory modules 314). Thus, the vapor chamber 350 may eliminate or help eliminate hot spots caused by the processor 316 by distributing the heat from the processor 316 throughout the chamber 350 (e.g., into the fluid 354). Thus, while there may be an uneven (per unit area) transfer of heat from the data center electronic devices 314 and 316 to the vapor chamber, an even or substantially even (per unit area) transfer of heat from the vapor chamber to the top hat assembly 322 may be achieved.

The vapor chamber 350 is mounted to the lid 308 of the base portion 306 through another thermal interface material 353 (e.g., a phase change material or otherwise thermally conductive material). Thus, a conductive heat transfer interface between the vapor chamber 350 and the lid 308 of the base portion 306.

The top hat 322, as shown, includes a cap 324 that is connected to the bottom 328 through sides 326. In combination, the cap 324, sides 326, and bottom 328 define a volume 334 through which a flow of a cooling liquid may be circulated.

As shown in this example, the cap 324 includes a cooling liquid inlet 330 through which a supply 340 of cooling liquid may enter. The cap 324 also includes a cooling liquid outlet 332 through which a return 342 of cooling liquid may exit. The volume 334 defines or includes a cooling liquid flow path between the inlet 330 and the outlet 332. As shown in this example, one or more heat transfer surfaces 336 (e.g., fins, undulations, ridges, or other extended surfaces that increase a heat transfer area) are positioned in the volume 334. The heat transfer surfaces 336 define channels 338, for example, through which the cooling liquid may be circulated to increase an amount of heat transferred from the data center electronic devices 314 and 316 to the cooling liquid (e.g., relative to an amount transferred in an implementation of the server tray package 300 that does not include the heat transfer surfaces 336). Alternative implementations of the server tray package 300 may include multiple inlets 330, multiple outlets 332, or may not include the heat transfer surfaces 336.

In an example operation of the server tray package 300 to cool the data center electronic devices 314 and 316, the server tray package 300 may be deployed, for example, in a data center server rack 105 in a data center. During operation of the server tray package 300, the processing device 316 and memory modules 314 generate heat that may need to be dissipated or removed from the server tray package 300 (e.g., for proper operation of the server tray package 300). Heat generated by the processing device 316 and memory modules 314 is transferred through the thermal interface material 318 and to the lid 308 of the base portion 306 of the liquid cold plate assembly 301. The transferred heat is further transferred from the lid 308, through the thermal interface material 320, and to the vapor chamber 350. As heat is transferred into the fluid 354, the fluid 354 may boil or vaporize. The boiling or vaporized fluid 354 naturally circulates toward a top of the vapor chamber 350, where heat is transferred to the bottom 328 of the top hat 322. As heat is transferred to the bottom 328, the vaporized or boiled fluid 354 condenses back into liquid form and falls back to the bottom of the vapor chamber 350.

The heat transferred to the bottom 328 of the top hat 322 is then transferred to the supply 340 of the cooling liquid that is circulated through the inlet 330 and into the volume 334 of the top hat 322. In some examples, the cooling liquid may be a chilled water or glycol, such as from one or more chillers fluidly coupled to the server tray package 300. In alternative examples, the cooling liquid may be a condenser water or other evaporatively-cooled liquid (e.g., without mechanical refrigeration). In other examples, the cooling liquid may be a dielectric single or two-phase fluid. In any event, the cooling liquid supply 340 may be at an appropriate temperature and flow rate to remove a desired amount of heat from the data center electronic devices 314 and 316.

In some examples, heat is transferred directly from the bottom 328 to the cooling liquid supply 340. Heat may also be transferred from the bottom 328, through one or more heat transfer surfaces 336, and then to the cooling liquid supply 340 that flows through channels 338. The heated cooling liquid supply 340 is circulated to the outlet 332 and exits the top hat 322 as the cooling liquid return 342 (e.g., that is at a higher temperature than the cooling liquid supply 340). The cooling liquid return 342 is circulated back, e.g., to a source of the cooling liquid, to expel the heat (e.g., in a chiller, cooling tower, or other heat exchanger) from the return 342.

Figure 3C:
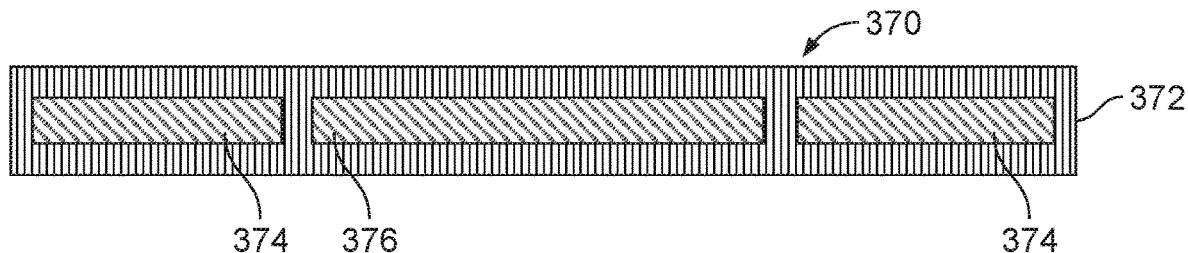
FIGS. 3C and 3D illustrate schematic side and top views of another example implementation of a vapor chamber that can be used in a liquid cold plate assembly in a server tray package.
Figure 3D:
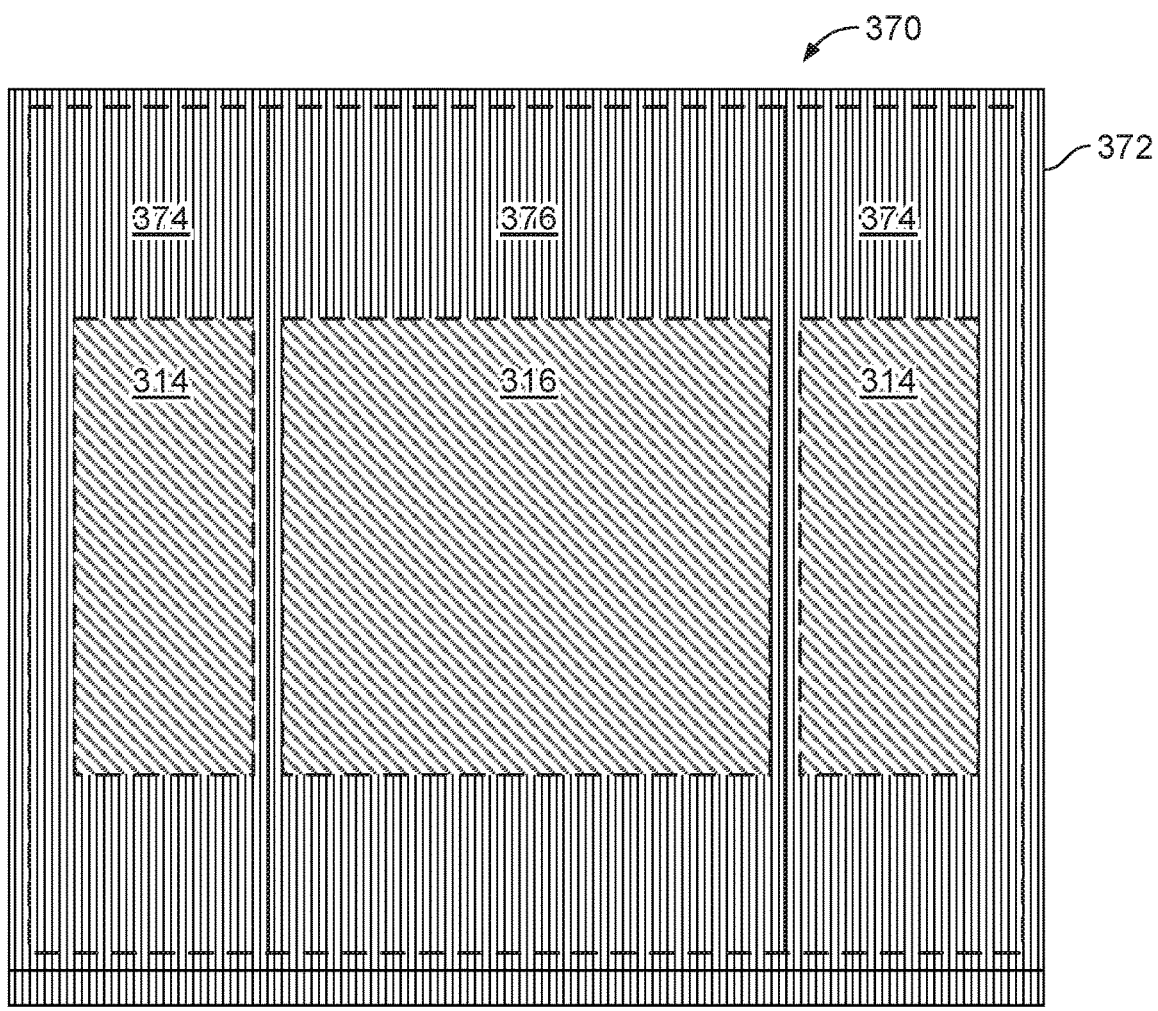
Figure 4A:
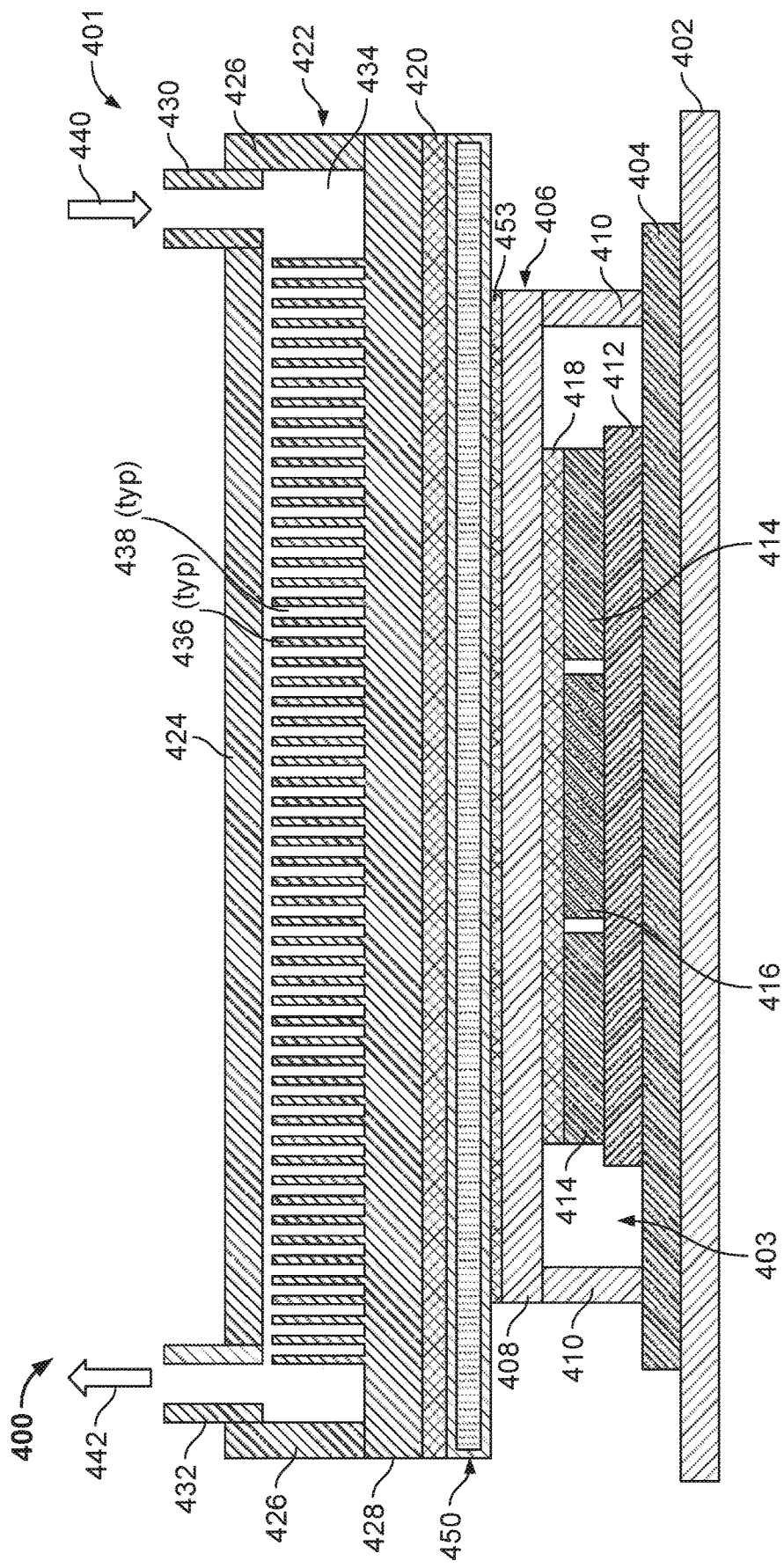
FIG. 4A illustrates a schematic cross-sectional side view of another example implementation of a server tray package that includes a liquid cold plate assembly and a vapor chamber.

FIGS. 3C and 3D illustrate schematic side and top views of another example implementation of a vapor chamber 370 that can be used in a liquid cold plate assembly in a server tray package, such as the server tray package 300. As shown, vapor chamber 370 has multiple sub-chambers formed in a housing 372; in this example, three sub-chambers split between two sub-chambers 374 and a sub-chamber 376. Heat transfer fluid may be contained in each sub-chamber 374 and 376. As further illustrated, the sub-chambers 374 may be differently sized (e.g., length and width) than the sub-chamber 376. As shown in FIG. 3D, the larger, single sub-chamber 376 may sit, when the vapor chamber 370 is positioned on the lid 308, over the processor 316, while the two sub-chambers 374 may sit over the memory modules 314. In this example, each sub-chamber may be tailored, e.g., according to the heat power output of the particular data center electronic device over which it sits. For example, the type of heat transfer fluid contained in, or dimensions of, each sub-chamber can be tailored to meet the heat transfer requirements to remove heat from the particular data center electronic device FIG. 4A illustrates a schematic cross-sectional side view of another example implementation of a server tray package 400 that includes a liquid cold plate assembly 401 and a vapor chamber 450. In some implementations, the server tray package 400 may be used as one or more of the server rack sub-assemblies 110 shown in FIG. 1. Referring to FIG. 4, the server tray package 400 includes a printed circuit board 402, e.g., motherboard 402, that supports one or more data center electronic devices; in this example, two or more memory modules 414 and one or more processing devices 416 (e.g., one or more application-specific integrated circuits (ASIC)). In some aspects, the motherboard 402 may be mounted on a frame (not shown), which can include or simply be a flat structure that can be grasped by technicians for moving the motherboard 402 into place and holding it in position within the rack 105. For example, the server tray package 400 may be mounted horizontally in the server rack 105 such as by sliding the frame into the slot 107 and over a pair of rails in the rack 105 on opposed sides of the server tray package 400—much like sliding a lunch tray into a cafeteria rack. The frame can extend below the motherboard 402 or can have other forms (e.g., by implementing it as a peripheral frame around the motherboard 402) or may be eliminated so that the motherboard itself is located in, e.g., slidably engages, the rack 105. The frame can be a flat plate or include one or more side walls that project upwardly from the edges of the flat plate, and the flat plate could be the floor of a closed-top or open-top box or cage.

In some examples, one motherboard 402 is mounted on a frame; alternatively, multiple motherboards 402 may be mounted on a frame, depending on the needs of the particular application. In some implementations, the one or more fans (not shown) can be placed on the motherboard 402 or a frame so that air enters at the front edge of the server tray package 400, closer to the front of the rack 105 when the server tray package 400 is installed in the rack 105, flows over the motherboard 402, over some of the data center electronic components on the motherboard 402, and is exhausted from the server tray package 400 at the back edge, closer to the back of the rack 105 when the server tray package 400 is installed in the rack 105. The one or more fans can be secured to the motherboard 402 or a frame by brackets.

As illustrated, a substrate 404 and an interposer 412 (e.g., a silicon interposer) are positioned between the data center electronic devices 414 and 416 and the motherboard 402. The substrate 404, for example, provides an interface between one or more of the data center electronic devices (e.g., the processing device 416) and the motherboard 402, such as through pins that provide electrical and communication interfaces. The substrate 404 also, in this example, may provide a mounting location for one or more components of the liquid cold plate assembly 401. The interposer 412, for example, provides a high bandwidth connection between the data center electronic devices, such as between the memory modules 414 and the processing device 416.

As shown in FIG. 4, the liquid cold plate assembly 401 includes a top portion 422, also referred to as a top hat 422, and a base portion 406. The base portion 406 includes a lid 408 that defines a top surface of the base portion 406 and sides 410 that couple the lid 408 to the substrate 404. In combination, the lid 408 and the sides 410 define or enclose a volume 403 in which the interposer 412 and the data center electronic devices 414 and 416 (mounted thereon) are positioned in the server tray package 400. As shown in this example, a thermal interface material 418 (e.g., a phase change material or otherwise thermally conductive material) is contactingly positioned between a bottom side of the lid 408 and the data center electronic devices 414 and 416 to provide a conductive heat transfer interface between these components.

In this example implementation, the top hat 422 is mounted to a vapor chamber 450 through another thermal interface material 420 (e.g., a phase change material or otherwise thermally conductive material) that provides a conductive heat transfer interface between a bottom 428 of the top hat 422 and the vapor chamber 450. Vapor chamber 450, in this example, can be a single chamber vapor chamber (e.g., as shown in FIG. 3B) or can be a multi-chamber vapor chamber (as shown in FIGS. 3C-3D or 4B-4C). Further, as shown in this example, the top hat 422 and vapor chamber 450 may be sized larger (e.g., length and width) than the base portion 406. Thus, as shown, the vapor chamber 450 and top hat 422 may overhang on two or more sides (two sides shown in FIG. 4A) of the lid 408 of the base portion 406. This vapor chamber 450/top hat 422 combination may provide for better heat transfer from the data center electronic devices 414 and 416 as compared to a vapor chamber/top hat combination that has dimensions (e.g., length and width) similar to those of the lid 408. Thus, more heat may be removed, or alternatively, less volumetric flow of the cooling liquid 440 may be circulated to the top hat 422 to produce the same amount of heat transfer performance.

In some aspects, one or more of the electronic devices (e.g., processor 416) may generate more heat than the other electronic devices (e.g., memory modules 414). Thus, the vapor chamber 450 may eliminate or help eliminate hot spots caused by the processor 416 by distributing the heat from the processor 416 throughout the chamber 450 (e.g., into the fluid). Thus, while there may be an uneven (per unit area) transfer of heat from the data center electronic devices 414 and 416 to the vapor chamber, an even or substantially even (per unit area) transfer of heat from the vapor chamber to the top hat assembly 422 may be achieved.

The vapor chamber 450 is mounted to the lid 408 of the base portion 406 through another thermal interface material 453 (e.g., a phase change material or otherwise thermally conductive material). Thus, a conductive heat transfer interface between the vapor chamber 450 and the lid 408 of the base portion 406.

The top hat 422, as shown, includes a cap 424 that is connected to the bottom 428 through sides 426. In combination, the cap 424, sides 426, and bottom 428 define a volume 434 through which a flow of a cooling liquid may be circulated. As shown in this example, the cap 424 includes a cooling liquid inlet 430 through which a supply 440 of cooling liquid may enter. The cap 424 also includes a cooling liquid outlet 432 through which a return 442 of cooling liquid may exit. The volume 434 defines or includes a cooling liquid flow path between the inlet 430 and the outlet 432. As shown in this example, one or more heat transfer surfaces 436 (e.g., fins, undulations, ridges, or other extended surfaces that increase a heat transfer area) are positioned in the volume 434. The heat transfer surfaces 436 define channels 438, for example, through which the cooling liquid may be circulated to increase an amount of heat transferred from the data center electronic devices 414 and 416 to the cooling liquid (e.g., relative to an amount transferred in an implementation of the server tray package 400 that does not include the heat transfer surfaces 436). Alternative implementations of the server tray package 400 may include multiple inlets 430, multiple outlets 432, or may not include the heat transfer surfaces 436.

In an example operation of the server tray package 400 to cool the data center electronic devices 414 and 416, the server tray package 400 may be deployed, for example, in a data center server rack 105 in a data center. During operation of the server tray package 400, the processing device 416 and memory modules 414 generate heat that may need to be dissipated or removed from the server tray package 400 (e.g., for proper operation of the server tray package 400). Heat generated by the processing device 416 and memory modules 414 is transferred through the thermal interface material 418 and to the lid 408 of the base portion 406 of the liquid cold plate assembly 401. The transferred heat is further transferred from the lid 408, through the thermal interface material 420, and to the vapor chamber 450. As heat is transferred into the fluid, the fluid may boil or vaporize. The boiling or vaporized fluid naturally circulates toward a top of the vapor chamber 450, where heat is transferred to the bottom 428 of the top hat 422. As heat is transferred to the bottom 428, the vaporized or boiled fluid condenses back into liquid form and falls back to the bottom of the vapor chamber 450.

The heat transferred to the bottom 428 of the top hat 422 is then transferred to the supply 440 of the cooling liquid that is circulated through the inlet 430 and into the volume 434 of the top hat 422. In some examples, the cooling liquid may be a chilled water or glycol, such as from one or more chillers fluidly coupled to the server tray package 400. In alternative examples, the cooling liquid may be a condenser water or other evaporatively-cooled liquid (e.g., without mechanical refrigeration). In other examples, the cooling liquid may be a dielectric single or two-phase fluid. In any event, the cooling liquid supply 440 may be at an appropriate temperature and flow rate to remove a desired amount of heat from the data center electronic devices 414 and 416.

In some examples, heat is transferred directly from the bottom 428 to the cooling liquid supply 440. Heat may also be transferred from the bottom 428, through one or more heat transfer surfaces 436, and then to the cooling liquid supply 440 that flows through channels 438. The heated cooling liquid supply 440 is circulated to the outlet 432 and exits the top hat 422 as the cooling liquid return 442 (e.g., that is at a higher temperature than the cooling liquid supply 440). The cooling liquid return 442 is circulated back, e.g., to a source of the cooling liquid, to expel the heat (e.g., in a chiller, cooling tower, or other heat exchanger) from the return 442.

Figure 4B:
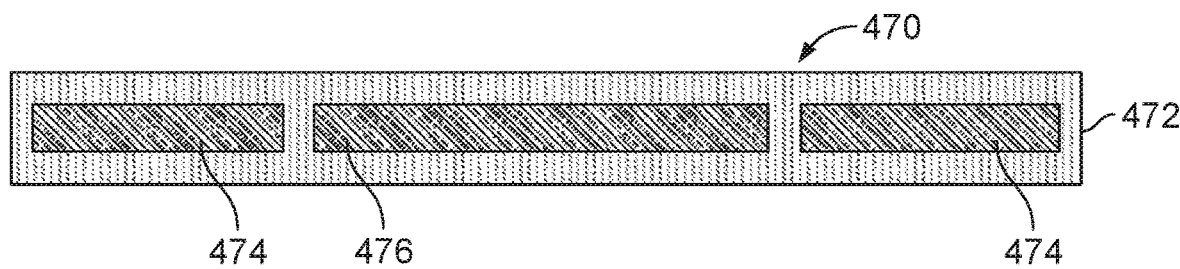
FIGS. 4B and 4C illustrate schematic side and top views of another example implementation of a vapor chamber that can be used in a liquid cold plate assembly in a server tray package.
Figure 4C:
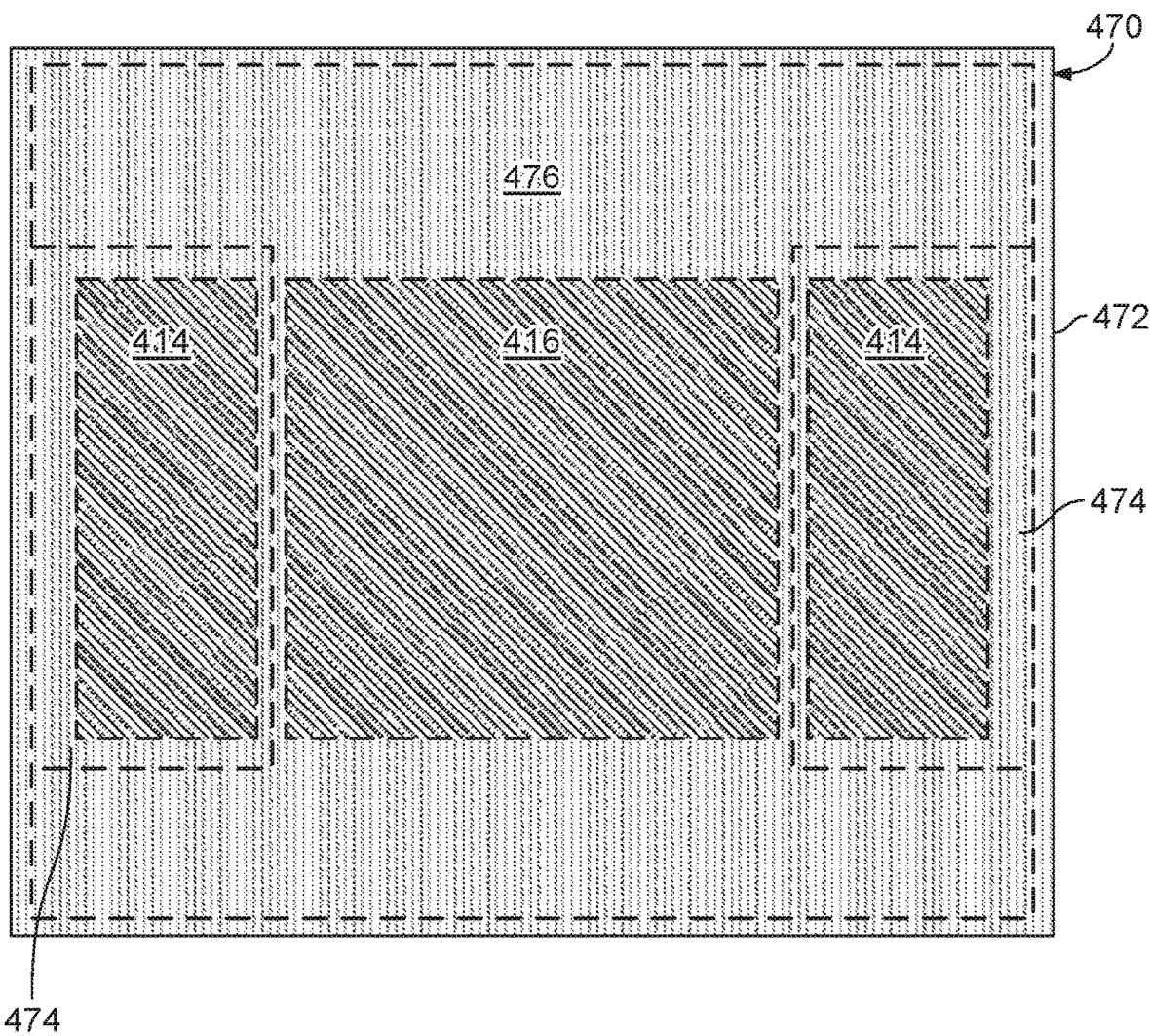

FIGS. 4B and 4C illustrate schematic side and top views of another example implementation of a vapor chamber 470 that can be used in a liquid cold plate assembly in a server tray package, such as server tray package 400. As shown, vapor chamber 470 has multiple sub-chambers; in this example, three sub-chambers split between two sub-chambers 474 and a sub-chamber 476. Heat transfer fluid may be contained in each sub-chamber 474 and 476. As further illustrated, the sub-chambers 474 may be differently sized (e.g., length and width and even shape) than the sub-chamber 476. As shown in FIG. 4C, the larger, single sub-chamber 476 may sit, when the vapor chamber 470 is positioned on the lid 408, over the processor 416 as well as extending adjacent the memory modules 414 (e.g., in an "I" or "H" shape). The two sub-chambers 474 may sit over the memory modules 414 and be rectangular in shape in this example. In this example, each sub-chamber may be tailored, e.g., according to the heat power output of the particular data center electronic device over which it sits. For example, the type of heat transfer fluid contained in, or dimensions or shape of, each sub-chamber can be tailored to meet the heat transfer requirements to remove heat from the particular data center electronic device.

Figure 5:
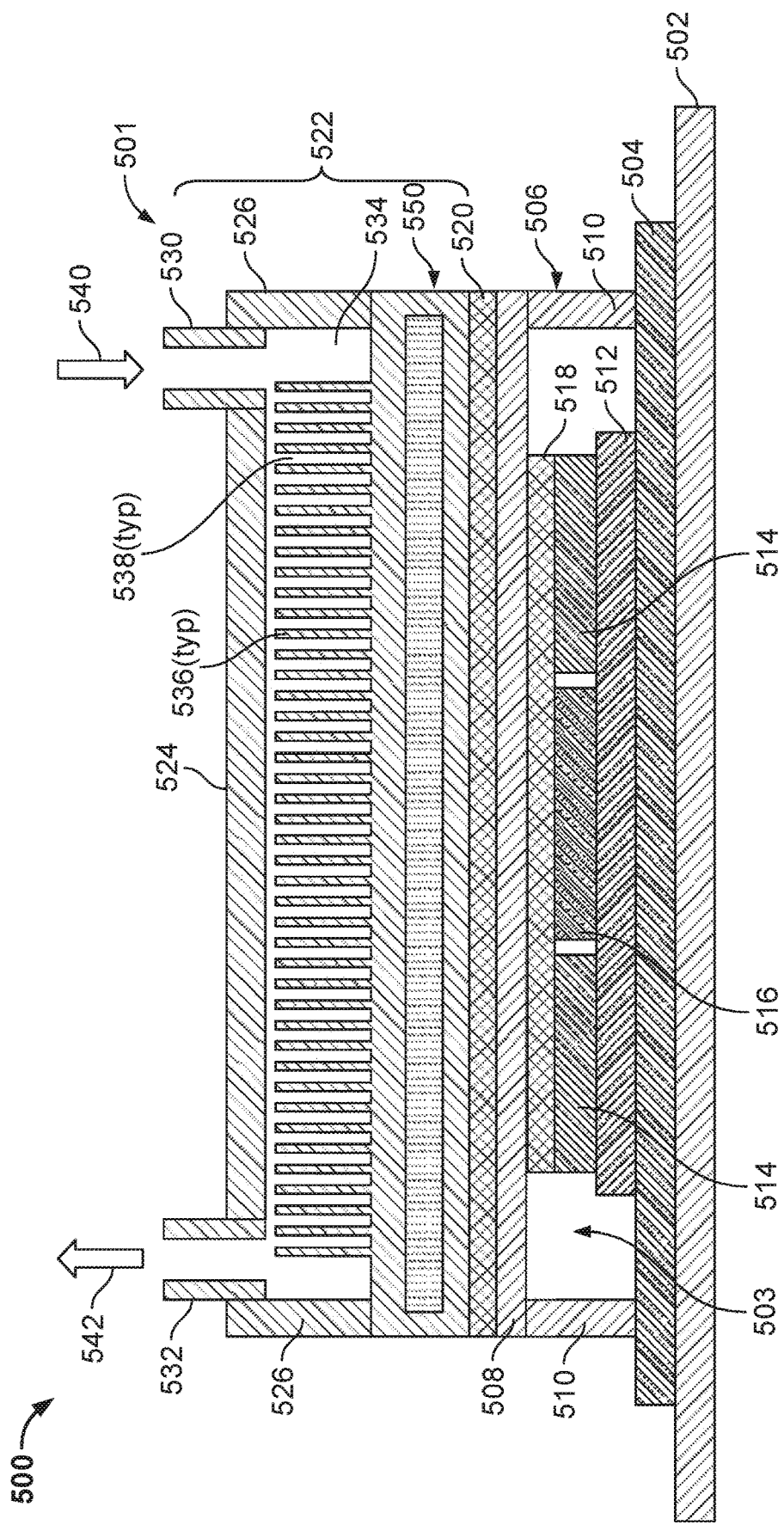
FIG. 5 illustrates a schematic cross-sectional side view of another example implementation of a server tray package that includes a liquid cold plate assembly and a vapor chamber.

FIG. 5 illustrates a schematic cross-sectional side view of another example implementation of a server tray package 500 that includes a liquid cold plate assembly 501 and a vapor chamber 550. In some implementations, the server tray package 500 may be used as one or more of the server rack sub-assemblies 110 shown in FIG. 1. Referring to FIG. 5, the server tray package 500 includes a printed circuit board 502, e.g., motherboard 502, that supports one or more data center electronic devices; in this example, two or more memory modules 514 and one or more processing devices 516 (e.g., one or more application-specific integrated circuits (ASIC)). In some aspects, the motherboard 502 may be mounted on a frame (not shown), which can include or simply be a flat structure that can be grasped by technicians for moving the motherboard 502 into place and holding it in position within the rack 105. For example, the server tray package 500 may be mounted horizontally in the server rack 105 such as by sliding the frame into the slot 107 and over a pair of rails in the rack 105 on opposed sides of the server tray package 500—much like sliding a lunch tray into a cafeteria rack. The frame can extend below the motherboard 502 or can have other forms (e.g., by implementing it as a peripheral frame around the motherboard 502) or may be eliminated so that the motherboard itself is located in, e.g., slidably engages, the rack 105. The frame can be a flat plate or include one or more side walls that project upwardly from the edges of the flat plate, and the flat plate could be the floor of a closed-top or open-top box or cage.

In some examples, one motherboard 502 is mounted on a frame; alternatively, multiple motherboards 502 may be mounted on a frame, depending on the needs of the particular application. In some implementations, the one or more fans (not shown) can be placed on the motherboard 502 or a frame so that air enters at the front edge of the server tray package 500, closer to the front of the rack 105 when the server tray package 500 is installed in the rack 105, flows over the motherboard 502, over some of the data center electronic components on the motherboard 502, and is exhausted from the server tray package 500 at the back edge, closer to the back of the rack 105 when the server tray package 500 is installed in the rack 105. The one or more fans can be secured to the motherboard 502 or a frame by brackets.

As illustrated, a substrate 504 and an interposer 512 (e.g., a silicon interposer) are positioned between the data center electronic devices 514 and 516 and the motherboard 502. The substrate 504, for example, provides an interface between one or more of the data center electronic devices (e.g., the processing device 516) and the motherboard 502, such as through pins that provide electrical and communication interfaces. The substrate 504 also, in this example, may provide a mounting location for one or more components of the liquid cold plate assembly 501. The interposer 512, for example, provides a high bandwidth connection between the data center electronic devices, such as between the memory modules 514 and the processing device 516.

As shown in FIG. 5, the liquid cold plate assembly 501 includes a top portion 522, also referred to as a top hat 522, and a base portion 506. The base portion 506 includes a lid 508 that defines a top surface of the base portion 506 and sides 510 that couple the lid 508 to the substrate 504. In combination, the lid 508 and the sides 510 define or enclose a volume 503 in which the interposer 512 and the data center electronic devices 514 and 516 (mounted thereon) are positioned in the server tray package 500. As shown in this example, a thermal interface material 518 (e.g., a phase change material or otherwise thermally conductive material) is contactingly positioned between a bottom side of the lid 508 and the data center electronic devices 514 and 516 to provide a conductive heat transfer interface between these components.

In this example implementation, the top hat 522 includes (is integrated with) a vapor chamber 550. The vapor chamber 550 may be a single chamber vapor chamber (e.g., as shown in FIG. 3B) or a multi-chamber vapor chamber (e.g., as shown in FIGS. 3C-3D or 4B-4C). As shown in this example, the vapor chamber 550 sits on top of the data center electronic devices 514 and 516. In some aspects, one or more of the electronic devices (e.g., processor 516) may generate more heat than the other electronic devices (e.g., memory modules 514). Thus, the vapor chamber 550 may eliminate or help eliminate hot spots caused by the processor 516 by distributing the heat from the processor 516 throughout the chamber 550 (e.g., into the fluid). Thus, while there may be an uneven (per unit area) transfer of heat from the data center electronic devices 514 and 516 to the vapor chamber, an even or substantially even (per unit area) transfer of heat from the vapor chamber to the top hat assembly 522 may be achieved.

The top hat 522 that includes the vapor chamber 550 is mounted to the lid 508 of the base portion 506 through another thermal interface material 520 (e.g., a phase change material or otherwise thermally conductive material). Thus, a conductive heat transfer interface between the top hat 522 and the lid 508 of the base portion 506, through the vapor chamber 550 and the thermal interface material 520.

The top hat 522, as shown, includes a cap 524 that is connected to vapor chamber 550 through sides 526. In combination, the cap 524, sides 526, and vapor chamber 550 define a volume 534 through which a flow of a cooling liquid may be circulated. As shown in this example, the cap 524 includes a cooling liquid inlet 530 through which a supply 540 of cooling liquid may enter. The cap 524 also includes a cooling liquid outlet 532 through which a return 542 of cooling liquid may exit. The volume 534 defines or includes a cooling liquid flow path between the inlet 530 and the outlet 532. As shown in this example, one or more heat transfer surfaces 536 (e.g., fins, undulations, ridges, or other extended surfaces that increase a heat transfer area) are positioned in the volume 534. The heat transfer surfaces 536 define channels 538, for example, through which the cooling liquid may be circulated to increase an amount of heat transferred from the data center electronic devices 514 and 516 to the cooling liquid (e.g., relative to an amount transferred in an implementation of the server tray package 500 that does not include the heat transfer surfaces 536). Alternative implementations of the server tray package 500 may include multiple inlets 530, multiple outlets 532, or may not include the heat transfer surfaces 536.

In an example operation of the server tray package 500 to cool the data center electronic devices 514 and 516, the server tray package 500 may be deployed, for example, in a data center server rack 105 in a data center. During operation of the server tray package 500, the processing device 516 and memory modules 514 generate heat that may need to be dissipated or removed from the server tray package 500 (e.g., for proper operation of the server tray package 500). Heat generated by the processing device 516 and memory modules 514 is transferred through the thermal interface material 518 and to the lid 508 of the base portion 506 of the liquid cold plate assembly 501. The transferred heat is further transferred from the lid 508, through the thermal interface material 520, and to the vapor chamber 550. As heat is transferred into the fluid, the fluid may boil or vaporize. The boiling or vaporized fluid naturally circulates toward a top of the vapor chamber 550, where heat is transferred to the supply 540 of the cooling liquid. As heat is transferred to the supply 540, the vaporized or boiled fluid condenses back into liquid form and falls back to the bottom of the vapor chamber 550.

The heat from the vapor chamber 550 is transferred to the supply 540 of the cooling liquid that is circulated through the inlet 530 and into the volume 534 of the top hat 522. In some examples, the cooling liquid may be a chilled water or glycol, such as from one or more chillers fluidly coupled to the server tray package 500. In alternative examples, the cooling liquid may be a condenser water or other evaporatively-cooled liquid (e.g., without mechanical refrigeration). In other examples, the cooling liquid may be a dielectric single or two-phase fluid. In any event, the cooling liquid supply 540 may be at an appropriate temperature and flow rate to remove a desired amount of heat from the data center electronic devices 514 and 516.

In some examples, heat is transferred directly from the vapor chamber 550 (the housing) to the cooling liquid supply 540. Heat may also be transferred from the housing of the vapor chamber 550, through one or more heat transfer surfaces 536, and then to the cooling liquid supply 540 that flows through channels 538. The heated cooling liquid supply 540 is circulated to the outlet 532 and exits the top hat 522 as the cooling liquid return 542 (e.g., that is at a higher temperature than the cooling liquid supply 540). The cooling liquid return 542 is circulated back, e.g., to a source of the cooling liquid, to expel the heat (e.g., in a chiller, cooling tower, or other heat exchanger) from the return 542.

Figure 6:
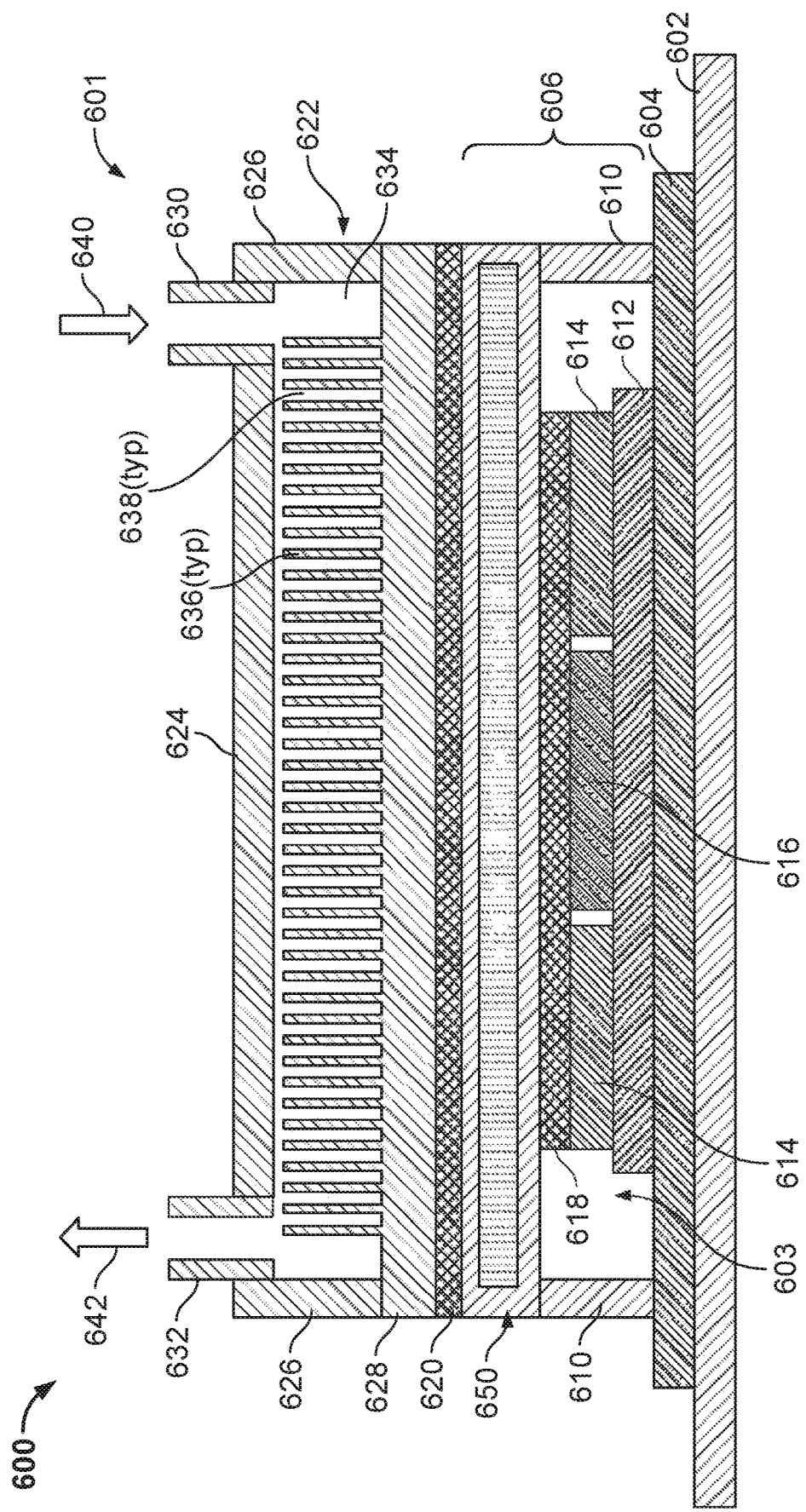
FIG. 6 illustrates a schematic cross-sectional side view of another example implementation of a server tray package that includes a liquid cold plate assembly and a vapor chamber.

FIG. 6 illustrates a schematic cross-sectional side view of another example implementation of a server tray package 600 that includes a liquid cold plate assembly 601 and a vapor chamber 650. In some implementations, the server tray package 600 may be used as one or more of the server rack sub-assemblies 110 shown in FIG. 1. Referring to FIG. 6, the server tray package 600 includes a printed circuit board 602, e.g., motherboard 602, that supports one or more data center electronic devices; in this example, two or more memory modules 614 and one or more processing devices 616 (e.g., one or more application-specific integrated circuits (ASIC)). In some aspects, the motherboard 602 may be mounted on a frame (not shown), which can include or simply be a flat structure that can be grasped by technicians for moving the motherboard 602 into place and holding it in position within the rack 105. For example, the server tray package 600 may be mounted horizontally in the server rack 105 such as by sliding the frame into the slot 107 and over a pair of rails in the rack 105 on opposed sides of the server tray package 600—much like sliding a lunch tray into a cafeteria rack. The frame can extend below the motherboard 602 or can have other forms (e.g., by implementing it as a peripheral frame around the motherboard 602) or may be eliminated so that the motherboard itself is located in, e.g., slidably engages, the rack 105. The frame can be a flat plate or include one or more side walls that project upwardly from the edges of the flat plate, and the flat plate could be the floor of a closed-top or open-top box or cage.

In some examples, one motherboard 602 is mounted on a frame; alternatively, multiple motherboards 602 may be mounted on a frame, depending on the needs of the particular application. In some implementations, the one or more fans (not shown) can be placed on the motherboard 602 or a frame so that air enters at the front edge of the server tray package 600, closer to the front of the rack 105 when the server tray package 600 is installed in the rack 105, flows over the motherboard 602, over some of the data center electronic components on the motherboard 602, and is exhausted from the server tray package 600 at the back edge, closer to the back of the rack 105 when the server tray package 600 is installed in the rack 105. The one or more fans can be secured to the motherboard 602 or a frame by brackets.

As illustrated, a substrate 604 and an interposer 612 (e.g., a silicon interposer) are positioned between the data center electronic devices 614 and 616 and the motherboard 602. The substrate 604, for example, provides an interface between one or more of the data center electronic devices (e.g., the processing device 616) and the motherboard 602, such as through pins that provide electrical and communication interfaces. The substrate 604 also, in this example, may provide a mounting location for one or more components of the liquid cold plate assembly 601. The interposer 612, for example, provides a high bandwidth connection between the data center electronic devices, such as between the memory modules 614 and the processing device 616.

As shown in FIG. 6, the liquid cold plate assembly 601 includes a top portion 622, also referred to as a top hat 622, and a base portion 606. The base portion 606 includes a vapor chamber 650 integrated therein that defines a top surface of the base portion 606 and sides 610 that couple the vapor chamber 650 to the substrate 604. In combination, the vapor chamber 650 and the sides 610 define or enclose a volume 603 in which the interposer 612 and the data center electronic devices 614 and 616 (mounted thereon) are positioned in the server tray package 600. As shown in this example, a thermal interface material 618 (e.g., a phase change material or otherwise thermally conductive material) is contactingly positioned between a bottom side of the vapor chamber 650 and the data center electronic devices 614 and 616 to provide a conductive heat transfer interface between these components.

In this example implementation, the top hat 622 is mounted to the vapor chamber 650 through another thermal interface material 620 (e.g., a phase change material or otherwise thermally conductive material) that provides a conductive heat transfer interface between a bottom 628 of the top hat 622 and the vapor chamber 650. The vapor chamber 650 may be a single chamber vapor chamber (e.g., as shown in FIG. 3B) or a multi-chamber vapor chamber (e.g., as shown in FIGS. 3C-3D or 4B-4C). As shown in this example, the vapor chamber 650 sits on top of the data center electronic devices 614 and 616. In some aspects, one or more of the electronic devices (e.g., processor 616) may generate more heat than the other electronic devices (e.g., memory modules 614). Thus, the vapor chamber 650 may eliminate or help eliminate hot spots caused by the processor 616 by distributing the heat from the processor 616 throughout the chamber 650 (e.g., into the fluid). Thus, while there may be an uneven (per unit area) transfer of heat from the data center electronic devices 614 and 616 to the vapor chamber, an even or substantially even (per unit area) transfer of heat from the vapor chamber to the top hat 622 may be achieved.

The top hat 622, as shown, includes a cap 624 that is connected to the bottom 628 through sides 626. In combination, the cap 624, sides 626, and bottom 628 define a volume 634 through which a flow of a cooling liquid may be circulated. As shown in this example, the cap 624 includes a cooling liquid inlet 630 through which a supply 640 of cooling liquid may enter. The cap 624 also includes a cooling liquid outlet 632 through which a return 642 of cooling liquid may exit. The volume 634 defines or includes a cooling liquid flow path between the inlet 630 and the outlet 632. As shown in this example, one or more heat transfer surfaces 636 (e.g., fins, undulations, ridges, or other extended surfaces that increase a heat transfer area) are positioned in the volume 634. The heat transfer surfaces 636 define channels 638, for example, through which the cooling liquid may be circulated to increase an amount of heat transferred from the data center electronic devices 614 and 616 to the cooling liquid (e.g., relative to an amount transferred in an implementation of the server tray package 600 that does not include the heat transfer surfaces 636). Alternative implementations of the server tray package 600 may include multiple inlets 630, multiple outlets 632, or may not include the heat transfer surfaces 636.

In an example operation of the server tray package 600 to cool the data center electronic devices 614 and 616, the server tray package 600 may be deployed, for example, in a data center server rack 105 in a data center. During operation of the server tray package 600, the processing device 616 and memory modules 614 generate heat that may need to be dissipated or removed from the server tray package 600 (e.g., for proper operation of the server tray package 600). Heat generated by the processing device 616 and memory modules 614 is transferred through the thermal interface material 618 and to the vapor chamber 650 of the base portion 606 of the liquid cold plate assembly 601. The transferred heat is transferred through the thermal interface material 620 and to the fluid of the vapor chamber 650. As heat is transferred into the fluid, the fluid may boil or vaporize. The boiling or vaporized fluid naturally circulates toward a top of the vapor chamber 650, where heat is transferred to the bottom 628 of the top hat 622. As heat is transferred to the bottom 628, the vaporized or boiled fluid condenses back into liquid form and falls back to the bottom of the vapor chamber 650.

The heat transferred to the bottom 628 of the top hat 622 is then transferred to the supply 640 of the cooling liquid that is circulated through the inlet 630 and into the volume 634 of the top hat 622. In some examples, the cooling liquid may be a chilled water or glycol, such as from one or more chillers fluidly coupled to the server tray package 600. In alternative examples, the cooling liquid may be a condenser water or other evaporatively-cooled liquid (e.g., without mechanical refrigeration). In other examples, the cooling liquid may be a dielectric single or two-phase fluid. In any event, the cooling liquid supply 640 may be at an appropriate temperature and flow rate to remove a desired amount of heat from the data center electronic devices 614 and 616.

In some examples, heat is transferred directly from the bottom 628 to the cooling liquid supply 640. Heat may also be transferred from the bottom 628, through one or more heat transfer surfaces 636, and then to the cooling liquid supply 640 that flows through channels 638. The heated cooling liquid supply 640 is circulated to the outlet 632 and exits the top hat 622 as the cooling liquid return 642 (e.g., that is at a higher temperature than the cooling liquid supply 640). The cooling liquid return 642 is circulated back, e.g., to a source of the cooling liquid, to expel the heat (e.g., in a chiller, cooling tower, or other heat exchanger) from the return 642.

Figure 7:
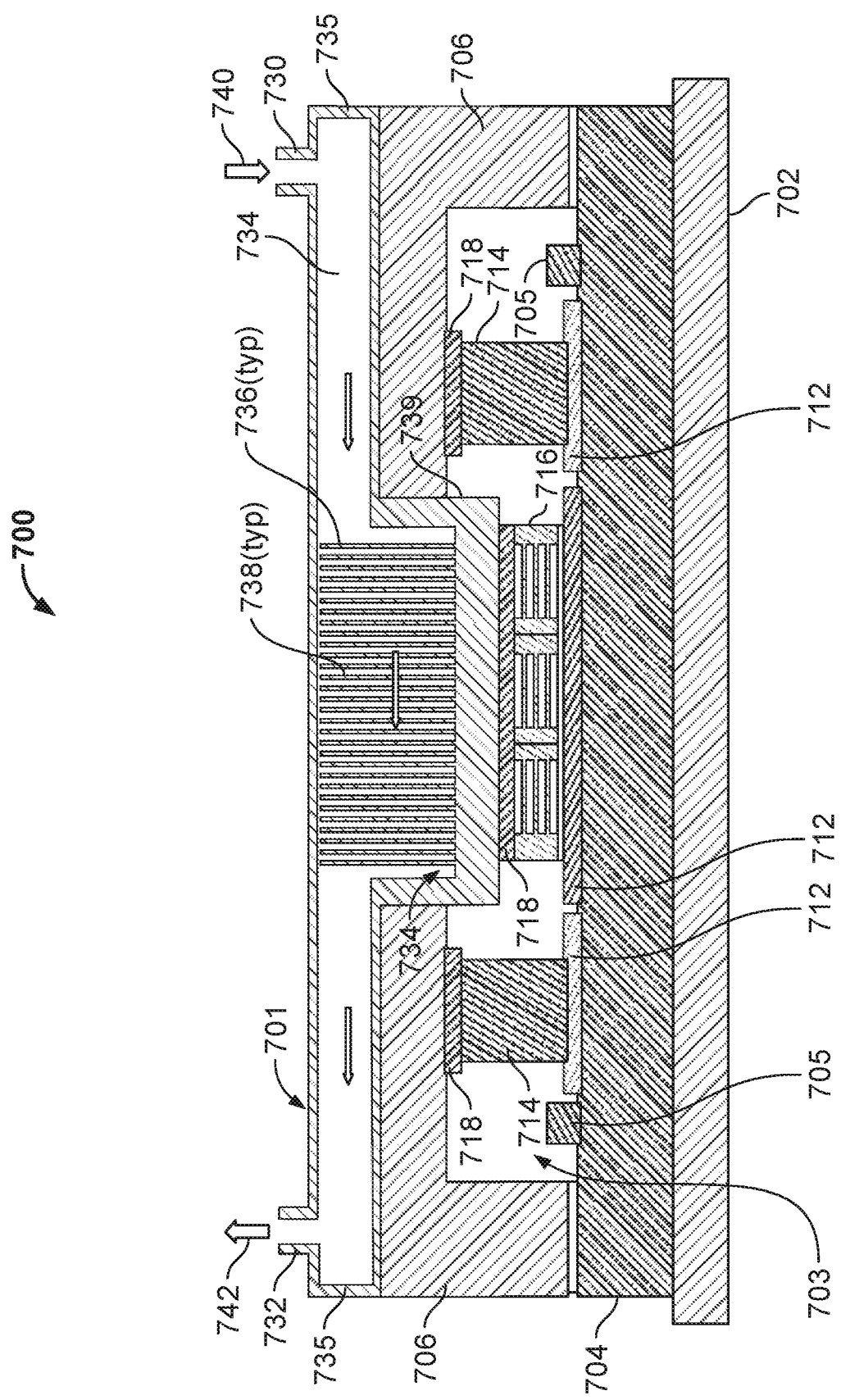
FIG. 7 illustrates a schematic cross-sectional side view of a portion of an example implementation of a server tray package that includes a liquid cold plate assembly set on a partial lid.

FIG. 7 illustrates a schematic cross-sectional side view of a portion of an example implementation of a server tray package 700 that includes a liquid cold plate assembly 701 set on a partial lid 706. In some implementations, the server tray package 700 may be used as one or more of the server rack sub-assemblies 110 shown in FIG. 1. Referring to FIG. 7, the server tray package 700 includes a printed circuit board 702, e.g., motherboard 702, that supports one or more data center electronic devices; in this example, two or more voltage regulators 714, two or more capacitors 705, and one or more processing devices 716 (e.g., one or more application-specific integrated circuits (ASIC)). In some aspects, the motherboard 702 may be mounted on a frame (not shown), which can include or simply be a flat structure that can be grasped by technicians for moving the motherboard 702 into place and holding it in position within the rack 105. For example, the server tray package 700 may be mounted horizontally in the server rack 105 such as by sliding the frame into the slot 107 and over a pair of rails in the rack 105 on opposed sides of the server tray package 700—much like sliding a lunch tray into a cafeteria rack. The frame can extend below the motherboard 702 or can have other forms (e.g., by implementing it as a peripheral frame around the motherboard 702) or may be eliminated so that the motherboard itself is located in, e.g., slidably engages, the rack 105. The frame can be a flat plate or include one or more side walls that project upwardly from the edges of the flat plate, and the flat plate could be the floor of a closed-top or open-top box or cage.

In some examples, one motherboard 702 is mounted on a frame; alternatively, multiple motherboards 702 may be mounted on a frame, depending on the needs of the particular application. In some implementations, the one or more fans (not shown) can be placed on the motherboard 702 or a frame so that air enters at the front edge of the server tray package 700, closer to the front of the rack 105 when the server tray package 700 is installed in the rack 105, flows over the motherboard 702, over some of the data center electronic components on the motherboard 702, and is exhausted from the server tray package 700 at the back edge, closer to the back of the rack 105 when the server tray package 700 is installed in the rack 105. The one or more fans can be secured to the motherboard 702 or a frame by brackets.

As illustrated, a substrate 704 and one or more interposers 712 (e.g., a silicon interposer) are positioned between the data center electronic devices 705, 714, and 716 and the motherboard 702. The substrate 704, for example, provides an interface between one or more of the data center electronic devices (e.g., the processing device 716) and the motherboard 702, such as through pins that provide electrical and communication interfaces. The substrate 704 also, in this example, may provide a mounting location for one or more components of the liquid cold plate assembly 701. The interposer 712, for example, provides a high bandwidth connection between the data center electronic devices, such as between the memory modules 714 and the processing device 716.

In the example of server tray package 700, the data center electronic devices 705, 714, and 716 may have different sizes and, more particularly, different heights. For instance, as shown, voltage regulators 714 may be taller (e.g., 2 to 3 times taller), relatively, than the processor 716 (and the capacitors 705). Further, in some aspects, the data center electronic devices 705, 714, and 716 may produce different heat outputs during their respective operations. For example, in some aspects, the processor 716 may produce much more heat during operation (e.g., at least an order of magnitude more) than the voltage regulators 714.

As shown in FIG. 7, the liquid cold plate assembly 701 includes side portions 735 and a base portion 739. As shown, the side portions 735 extend from the base portion 739 and are thinner (e.g., shorter in vertical distance) than the base portion 739. Although not shown, from a top view, the liquid cold plate assembly 701 may be relatively square in shape, with the side portions 735 being part of a perimeter area that circumscribes the base portion 739.

The lid 706, or partial lid 706, sits on the substrate 704 and includes an aperture through which the base portion 739 may extend when the liquid cold plate assembly 701 rests on the lid 706. Although not shown, from a top view, the partial lid 706 may be a square ring in shape, with the aperture shaped as a square to allow insertion of the base portion 739 of the liquid cold plate assembly when the side portions 735 rest on the partial lid 706.

As shown, the partial lid 706 defines or encloses a volume 703 in which the interposer 712 and the data center electronic devices 705, 714, and 716 (mounted thereon) are positioned in the server tray package 700. As shown in this example, a thermal interface material 718 (e.g., a phase change material or otherwise thermally conductive material) is contactingly positioned between a bottom side of the partial lid 706 and the data center electronic devices 714 to provide a conductive heat transfer interface between these components.

In this example implementation, the side portions 735 are mounted to a top surface of the partial lid 706. When the side portions 735 are mounted to the top of the partial lid 706, the base 739 (e.g., a bottom surface of the base 739) is positioned in thermal contact with a top surface of processor 716 through phase change material 718 (or otherwise thermally conductive material) that provides a conductive heat transfer interface between a bottom the base portion 739 and the processor 716.

As shown in this example, the liquid cold plate assembly 701 includes a cooling liquid inlet 730 through which a supply 740 of cooling liquid may enter. The liquid cold plate assembly 701 also includes a cooling liquid outlet 732 through which a return 742 of cooling liquid may exit. A volume 734 defines or includes a cooling liquid flow path between the inlet 730 and the outlet 732. As shown in this example, one or more heat transfer surfaces 736 (e.g., fins, undulations, ridges, or other extended surfaces that increase a heat transfer area) are positioned in the volume 734. In this example, the heat transfer surfaces 736 extend from at or near a top interior surface of the assembly 701 to at or near a bottom interior surface of the base portion 739 of the assembly 701.

The heat transfer surfaces 736 define channels 738, for example, through which the cooling liquid may be circulated to increase an amount of heat transferred from the data center electronic devices 714 and 716 to the cooling liquid (e.g., relative to an amount transferred in an implementation of the server tray package 700 that does not include the heat transfer surfaces 736). Alternative implementations of the server tray package 700 may include multiple inlets 730, multiple outlets 732, or may not include the heat transfer surfaces 736.

In an example operation of the server tray package 700 to cool the data center electronic devices 714 and 716, the server tray package 700 may be deployed, for example, in a data center server rack 105 in a data center. During operation of the server tray package 700, the processing device 716 and voltage regulators 714 generate heat that may need to be dissipated or removed from the server tray package 700 (e.g., for proper operation of the server tray package 700). Heat generated by the processing device 716 is transferred through the thermal interface material 718 and to the base portion 739 of the liquid cold plate assembly 701. Heat generated by the voltage regulators 714 is transferred through the thermal interface material 718, through the partial lid 706, and to the side portions 735 of the liquid cold plate assembly 701. In some examples, one or more components of the liquid cold plate assembly 701 may be formed or made from a thermally conductive material, such as copper, aluminum, a combination of copper and aluminum, or other thermally conductive materials.

The heat transferred to the base portion 739 and side portions 735 of the liquid cold plate assembly 701 is then transferred to the supply 740 of the cooling liquid that is circulated through the inlet 730 and into the volume 734 of the liquid cold plate assembly 701. In some examples, the cooling liquid may be a chilled water or glycol, such as from one or more chillers fluidly coupled to the server tray package 700. In alternative examples, the cooling liquid may be a condenser water or other evaporatively-cooled liquid (e.g., without mechanical refrigeration). In other examples, the cooling liquid may be a dielectric single or two-phase fluid. In any event, the cooling liquid supply 740 may be at an appropriate temperature and flow rate to remove a desired amount of heat from the data center electronic devices 714 and 716.

In some examples, heat is transferred directly from the base portion 739 to the cooling liquid supply 740. Heat may also be transferred from the base portion 739, through one or more heat transfer surfaces 736 (in this example, confined to the base portion 739), and then to the cooling liquid supply 740 that flows through channels 738. The heated cooling liquid supply 740 is circulated to the outlet 732 and exits the liquid cold plate assembly 701 as the cooling liquid return 742 (e.g., that is at a higher temperature than the cooling liquid supply 740). The cooling liquid return 742 is circulated back, e.g., to a source of the cooling liquid, to expel the heat (e.g., in a chiller, cooling tower, or other heat exchanger) from the return 742.

Figure 8:
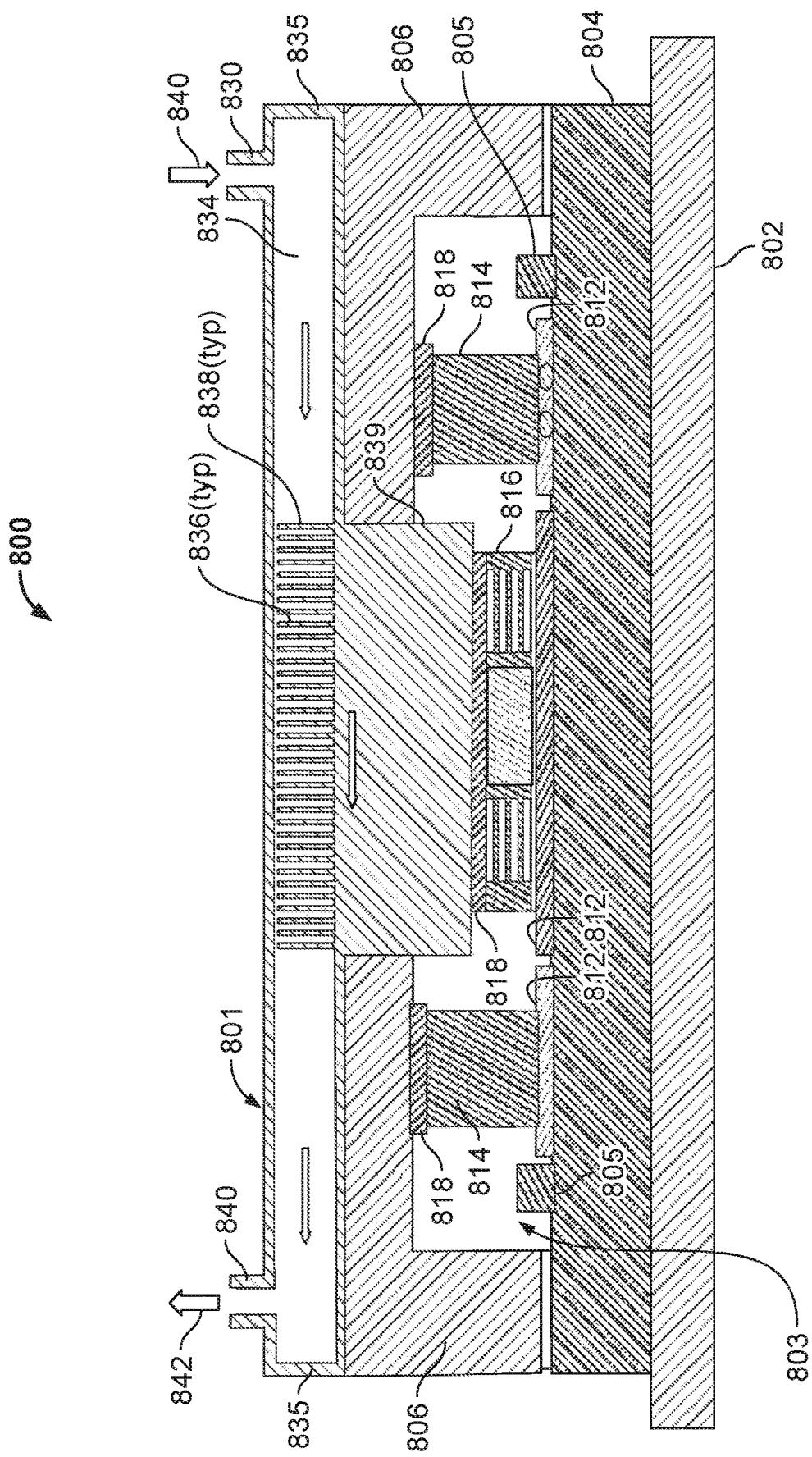
FIG. 8 illustrates a schematic cross-sectional side view of a portion of an example implementation of a server tray package that includes a liquid cold plate assembly set on a partial lid.

FIG. 8 illustrates a schematic cross-sectional side view of a portion of an example implementation of a server tray package 800 that includes a liquid cold plate assembly 801 set on a partial lid 806. In some implementations, the server tray package 800 may be used as one or more of the server rack sub-assemblies 110 shown in FIG. 1. Referring to FIG. 8, the server tray package 800 includes a printed circuit board 802, e.g., motherboard 802, that supports one or more data center electronic devices; in this example, two or more voltage regulators 814, two or more capacitors 805, and one or more processing devices 816 (e.g., one or more application-specific integrated circuits (ASIC)). In some aspects, the motherboard 802 may be mounted on a frame (not shown), which can include or simply be a flat structure that can be grasped by technicians for moving the motherboard 802 into place and holding it in position within the rack 105. For example, the server tray package 800 may be mounted horizontally in the server rack 105 such as by sliding the frame into the slot 107 and over a pair of rails in the rack 105 on opposed sides of the server tray package 800—much like sliding a lunch tray into a cafeteria rack. The frame can extend below the motherboard 802 or can have other forms (e.g., by implementing it as a peripheral frame around the motherboard 802) or may be eliminated so that the motherboard itself is located in, e.g., slidably engages, the rack 105. The frame can be a flat plate or include one or more side walls that project upwardly from the edges of the flat plate, and the flat plate could be the floor of a closed-top or open-top box or cage.

In some examples, one motherboard 802 is mounted on a frame; alternatively, multiple motherboards 802 may be mounted on a frame, depending on the needs of the particular application. In some implementations, the one or more fans (not shown) can be placed on the motherboard 802 or a frame so that air enters at the front edge of the server tray package 800, closer to the front of the rack 105 when the server tray package 800 is installed in the rack 105, flows over the motherboard 802, over some of the data center electronic components on the motherboard 802, and is exhausted from the server tray package 800 at the back edge, closer to the back of the rack 105 when the server tray package 800 is installed in the rack 105. The one or more fans can be secured to the motherboard 802 or a frame by brackets.

As illustrated, a substrate 804 and one or more interposers 812 (e.g., a silicon interposer) are positioned between the data center electronic devices 805, 814, and 816 and the motherboard 802. The substrate 804, for example, provides an interface between one or more of the data center electronic devices (e.g., the processing device 816) and the motherboard 802, such as through pins that provide electrical and communication interfaces. The substrate 804 also, in this example, may provide a mounting location for one or more components of the liquid cold plate assembly 801. The interposer 812, for example, provides a high bandwidth connection between the data center electronic devices, such as between the memory modules 814 and the processing device 816.

In the example of server tray package 800, the data center electronic devices 805, 814, and 816 may have different sizes and, more particularly, different heights. For instance, as shown, voltage regulators 814 may be taller (e.g., 2 to 3 times taller), relatively, than the processor 816 (and the capacitors 805). Further, in some aspects, the data center electronic devices 805, 814, and 816 may produce different heat outputs during their respective operations. For example, in some aspects, the processor 816 may produce much more heat during operation (e.g., at least an order of magnitude more) than the voltage regulators 814.

As shown in FIG. 8, the liquid cold plate assembly 801 includes side portions 835 and a base portion 839. As shown, the side portions 835 extend from the base portion 839 and are thinner (e.g., shorter in vertical distance) than the base portion 839. Although not shown, from a top view, the liquid cold plate assembly 801 may be relatively square in shape, with the side portions 835 being part of a perimeter area that circumscribes the base portion 839.

The lid 806, or partial lid 806, sits on the substrate 804 and includes an aperture through which the base portion 839 may extend when the liquid cold plate assembly 801 rests on the lid 806. Although not shown, from a top view, the partial lid 806 may be a square ring in shape, with the aperture shaped as a square to allow insertion of the base portion 839 of the liquid cold plate assembly when the side portions 835 rest on the partial lid 806.

As shown, the partial lid 806 defines or encloses a volume 803 in which the interposer 812 and the data center electronic devices 805, 814, and 816 (mounted thereon) are positioned in the server tray package 800. As shown in this example, a thermal interface material 818 (e.g., a phase change material or otherwise thermally conductive material) is contactingly positioned between a bottom side of the partial lid 806 and the data center electronic devices 814 to provide a conductive heat transfer interface between these components.

In this example implementation, the side portions 835 are mounted to a top surface of the partial lid 806. When the side portions 835 are mounted to the top of the partial lid 806, the base 839 (e.g., a bottom surface of the base 839) is positioned in thermal contact with a top surface of processor 816 through phase change material 818 (or otherwise thermally conductive material) that provides a conductive heat transfer interface between a bottom the base portion 839 and the processor 816.

As shown in this example, the liquid cold plate assembly 801 includes a cooling liquid inlet 830 through which a supply 840 of cooling liquid may enter. The liquid cold plate assembly 801 also includes a cooling liquid outlet 832 through which a return 842 of cooling liquid may exit. A volume 834 defines or includes a cooling liquid flow path between the inlet 830 and the outlet 832. As shown in this example, one or more heat transfer surfaces 836 (e.g., fins, undulations, ridges, or other extended surfaces that increase a heat transfer area) are positioned in the volume 834. In this example, the heat transfer surfaces 836 extend from at or near a top interior surface of the assembly 801 to at or near a top interior surface of the base portion 839 of the assembly 801. Thus, in this example, the volume 834 (and the heat transfer surfaces 836) has a substantially uniform height between the inlet 830 and the outlet 840.

The heat transfer surfaces 836 define channels 838, for example, through which the cooling liquid may be circulated to increase an amount of heat transferred from the data center electronic devices 814 and 816 to the cooling liquid (e.g., relative to an amount transferred in an implementation of the server tray package 800 that does not include the heat transfer surfaces 836). Alternative implementations of the server tray package 800 may include multiple inlets 830, multiple outlets 832, or may not include the heat transfer surfaces 836.

In an example operation of the server tray package 800 to cool the data center electronic devices 814 and 816, the server tray package 800 may be deployed, for example, in a data center server rack 105 in a data center. During operation of the server tray package 800, the processing device 816 and voltage regulators 814 generate heat that may need to be dissipated or removed from the server tray package 800 (e.g., for proper operation of the server tray package 800). Heat generated by the processing device 816 is transferred through the thermal interface material 818 and to the base portion 839 of the liquid cold plate assembly 801. Heat generated by the voltage regulators 814 is transferred through the thermal interface material 818, through the partial lid 806, and to the side portions 835 of the liquid cold plate assembly 801. In some examples, one or more components of the liquid cold plate assembly 801 may be formed or made from a thermally conductive material, such as copper, aluminum, a combination of copper and aluminum, or other thermally conductive materials.

The heat transferred to the base portion 839 and side portions 835 of the liquid cold plate assembly 801 is then transferred to the supply 840 of the cooling liquid that is circulated through the inlet 830 and into the volume 834 of the liquid cold plate assembly 801. In some examples, the cooling liquid may be a chilled water or glycol, such as from one or more chillers fluidly coupled to the server tray package 800. In alternative examples, the cooling liquid may be a condenser water or other evaporatively-cooled liquid (e.g., without mechanical refrigeration). In other examples, the cooling liquid may be a dielectric single or two-phase fluid. In any event, the cooling liquid supply 840 may be at an appropriate temperature and flow rate to remove a desired amount of heat from the data center electronic devices 814 and 816.

In some examples, heat is transferred directly from the base portion 839 to the cooling liquid supply 840. Heat may also be transferred from the base portion 839, through one or more heat transfer surfaces 836 (in this example, confined to the base portion 839 but only the height of the volume 834), and then to the cooling liquid supply 840 that flows through channels 838. The heated cooling liquid supply 840 is circulated to the outlet 832 and exits the liquid cold plate assembly 801 as the cooling liquid return 842 (e.g., that is at a higher temperature than the cooling liquid supply 840). The cooling liquid return 842 is circulated back, e.g., to a source of the cooling liquid, to expel the heat (e.g., in a chiller, cooling tower, or other heat exchanger) from the return 842.

Figure 9:
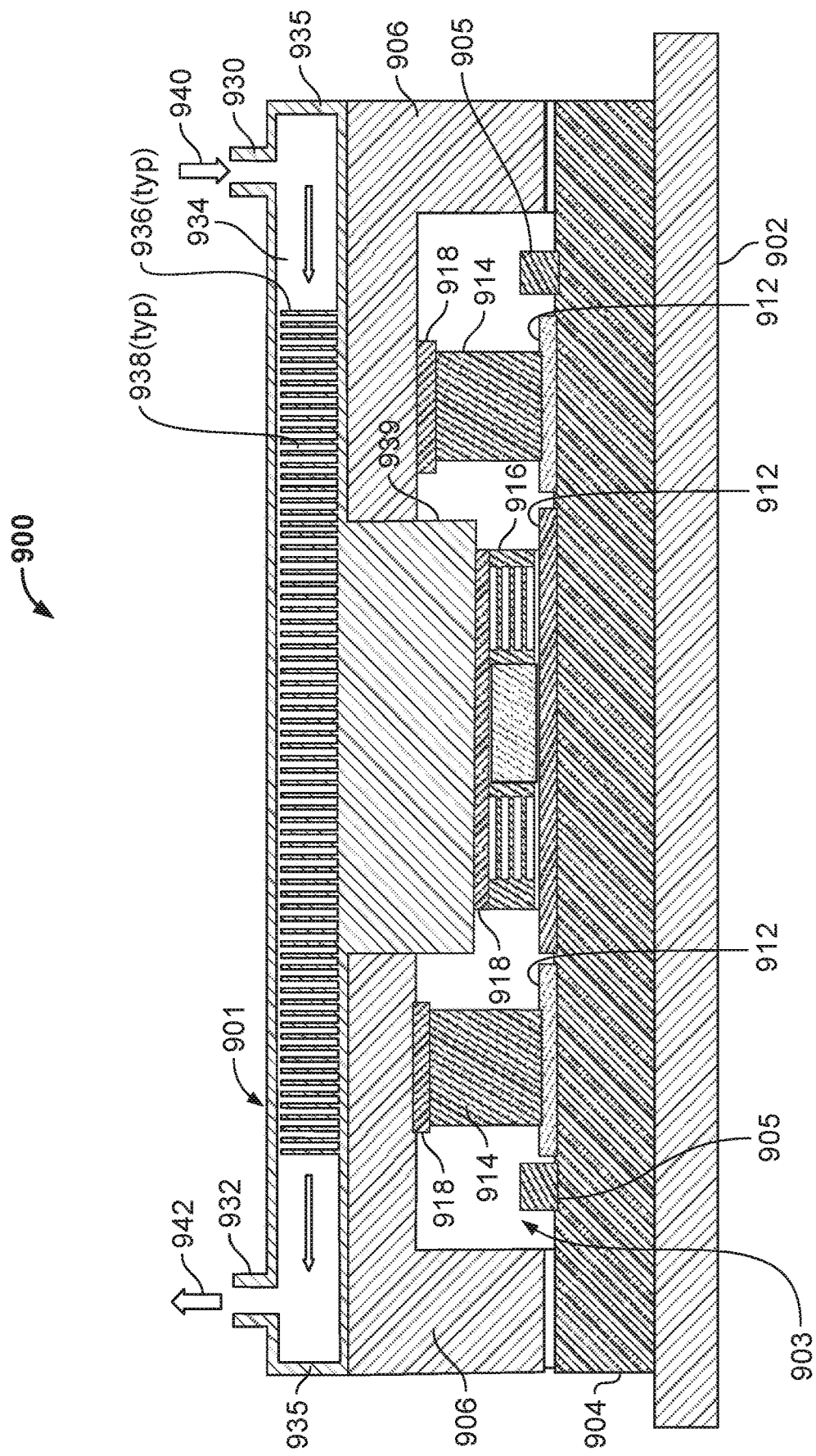
FIG. 9 illustrates a schematic cross-sectional side view of a portion of another example implementation of a server tray package that includes a liquid cold plate assembly set on a partial lid.

FIG. 9 illustrates a schematic cross-sectional side view of a portion of another example implementation of a server tray package 900 that includes a liquid cold plate assembly 901 set on a partial lid 906. In some implementations, the server tray package 900 may be used as one or more of the server rack sub-assemblies 110 shown in FIG. 1. Referring to FIG. 9, the server tray package 900 includes a printed circuit board 902, e.g., motherboard 902, that supports one or more data center electronic devices; in this example, two or more voltage regulators 914, two or more capacitors 905, and one or more processing devices 916 (e.g., one or more application-specific integrated circuits (ASIC)). In some aspects, the motherboard 902 may be mounted on a frame (not shown), which can include or simply be a flat structure that can be grasped by technicians for moving the motherboard 902 into place and holding it in position within the rack 105. For example, the server tray package 900 may be mounted horizontally in the server rack 105 such as by sliding the frame into the slot 107 and over a pair of rails in the rack 105 on opposed sides of the server tray package 900—much like sliding a lunch tray into a cafeteria rack. The frame can extend below the motherboard 902 or can have other forms (e.g., by implementing it as a peripheral frame around the motherboard 902) or may be eliminated so that the motherboard itself is located in, e.g., slidably engages, the rack 105. The frame can be a flat plate or include one or more side walls that project upwardly from the edges of the flat plate, and the flat plate could be the floor of a closed-top or open-top box or cage.

In some examples, one motherboard 902 is mounted on a frame; alternatively, multiple motherboards 902 may be mounted on a frame, depending on the needs of the particular application. In some implementations, the one or more fans (not shown) can be placed on the motherboard 902 or a frame so that air enters at the front edge of the server tray package 900, closer to the front of the rack 105 when the server tray package 900 is installed in the rack 105, flows over the motherboard 902, over some of the data center electronic components on the motherboard 902, and is exhausted from the server tray package 900 at the back edge, closer to the back of the rack 105 when the server tray package 900 is installed in the rack 105. The one or more fans can be secured to the motherboard 902 or a frame by brackets.

As illustrated, a substrate 904 and one or more interposers 912 (e.g., a silicon interposer) are positioned between the data center electronic devices 905, 914, and 916 and the motherboard 902. The substrate 904, for example, provides an interface between one or more of the data center electronic devices (e.g., the processing device 916) and the motherboard 902, such as through pins that provide electrical and communication interfaces. The substrate 904 also, in this example, may provide a mounting location for one or more components of the liquid cold plate assembly 901. The interposer 912, for example, provides a high bandwidth connection between the data center electronic devices, such as between the memory modules 914 and the processing device 916.

In the example of server tray package 900, the data center electronic devices 905, 914, and 916 may have different sizes and, more particularly, different heights. For instance, as shown, voltage regulators 914 may be taller (e.g., 2 to 3 times taller), relatively, than the processor 916 (and the capacitors 905). Further, in some aspects, the data center electronic devices 905, 914, and 916 may produce different heat outputs during their respective operations. For example, in some aspects, the processor 916 may produce much more heat during operation (e.g., at least an order of magnitude more) than the voltage regulators 914.

As shown in FIG. 9, the liquid cold plate assembly 901 includes side portions 935 and a base portion 939. As shown, the side portions 935 extend from the base portion 939 and are thinner (e.g., shorter in vertical distance) than the base portion 939. Although not shown, from a top view, the liquid cold plate assembly 901 may be relatively square in shape, with the side portions 935 being part of a perimeter area that circumscribes the base portion 939.

The lid 906, or partial lid 906, sits on the substrate 904 and includes an aperture through which the base portion 939 may extend when the liquid cold plate assembly 901 rests on the lid 906. Although not shown, from a top view, the partial lid 906 may be a square ring in shape, with the aperture shaped as a square to allow insertion of the base portion 939 of the liquid cold plate assembly when the side portions 935 rest on the partial lid 906.

As shown, the partial lid 906 defines or encloses a volume 903 in which the interposer 912 and the data center electronic devices 905, 914, and 916 (mounted thereon) are positioned in the server tray package 900. As shown in this example, a thermal interface material 918 (e.g., a phase change material or otherwise thermally conductive material) is contactingly positioned between a bottom side of the partial lid 906 and the data center electronic devices 914 to provide a conductive heat transfer interface between these components.

In this example implementation, the side portions 935 are mounted to a top surface of the partial lid 906. When the side portions 935 are mounted to the top of the partial lid 906, the base 939 (e.g., a bottom surface of the base 939) is positioned in thermal contact with a top surface of processor 916 through phase change material 918 (or otherwise thermally conductive material) that provides a conductive heat transfer interface between a bottom the base portion 939 and the processor 916.

As shown in this example, the liquid cold plate assembly 901 includes a cooling liquid inlet 930 through which a supply 940 of cooling liquid may enter. The liquid cold plate assembly 901 also includes a cooling liquid outlet 932 through which a return 942 of cooling liquid may exit. A volume 934 defines or includes a cooling liquid flow path between the inlet 930 and the outlet 932. As shown in this example, one or more heat transfer surfaces 936 (e.g., fins, undulations, ridges, or other extended surfaces that increase a heat transfer area) are positioned in the volume 934. In this example, the heat transfer surfaces 936 extend from at or near a top interior surface of the assembly 901 to at or near a top interior surface of the base portion 939 of the assembly 901. Thus, in this example, the volume 934 (and the heat transfer surfaces 936) has a substantially uniform height between the inlet 930 and the outlet 932. Further, as shown in this example, the heat transfer surfaces extend from at or near the inlet 930 to at or near the outlet 932.

The heat transfer surfaces 936 define channels 938, for example, through which the cooling liquid may be circulated to increase an amount of heat transferred from the data center electronic devices 914 and 916 to the cooling liquid (e.g., relative to an amount transferred in an implementation of the server tray package 900 that does not include the heat transfer surfaces 936). Alternative implementations of the server tray package 900 may include multiple inlets 930, multiple outlets 932, or may not include the heat transfer surfaces 936.

In an example operation of the server tray package 900 to cool the data center electronic devices 914 and 916, the server tray package 900 may be deployed, for example, in a data center server rack 105 in a data center. During operation of the server tray package 900, the processing device 916 and voltage regulators 914 generate heat that may need to be dissipated or removed from the server tray package 900 (e.g., for proper operation of the server tray package 900). Heat generated by the processing device 916 is transferred through the thermal interface material 918 and to the base portion 939 of the liquid cold plate assembly 901. Heat generated by the voltage regulators 914 is transferred through the thermal interface material 918, through the partial lid 906, and to the side portions 935 of the liquid cold plate assembly 901. In some examples, one or more components of the liquid cold plate assembly 901 may be formed or made from a thermally conductive material, such as copper, aluminum, a combination of copper and aluminum, or other thermally conductive materials.

The heat transferred to the base portion 939 and side portions 935 of the liquid cold plate assembly 901 is then transferred to the supply 940 of the cooling liquid that is circulated through the inlet 930 and into the volume 934 of the liquid cold plate assembly 901. In some examples, the cooling liquid may be a chilled water or glycol, such as from one or more chillers fluidly coupled to the server tray package 900. In alternative examples, the cooling liquid may be a condenser water or other evaporatively-cooled liquid (e.g., without mechanical refrigeration). In other examples, the cooling liquid may be a dielectric single or two-phase fluid. In any event, the cooling liquid supply 940 may be at an appropriate temperature and flow rate to remove a desired amount of heat from the data center electronic devices 914 and 916.

In some examples, heat is transferred directly from the base portion 939 to the cooling liquid supply 940. Heat may also be transferred from the base portion 939, through one or more heat transfer surfaces 936 (in this example, extending across the volume 934 between the inlet 930 and outlet 932), and then to the cooling liquid supply 940 that flows through channels 938. The heated cooling liquid supply 940 is circulated to the outlet 932 and exits the liquid cold plate assembly 901 as the cooling liquid return 942 (e.g., that is at a higher temperature than the cooling liquid supply 940). The cooling liquid return 942 is circulated back, e.g., to a source of the cooling liquid, to expel the heat (e.g., in a chiller, cooling tower, or other heat exchanger) from the return 942.

Figure 10:
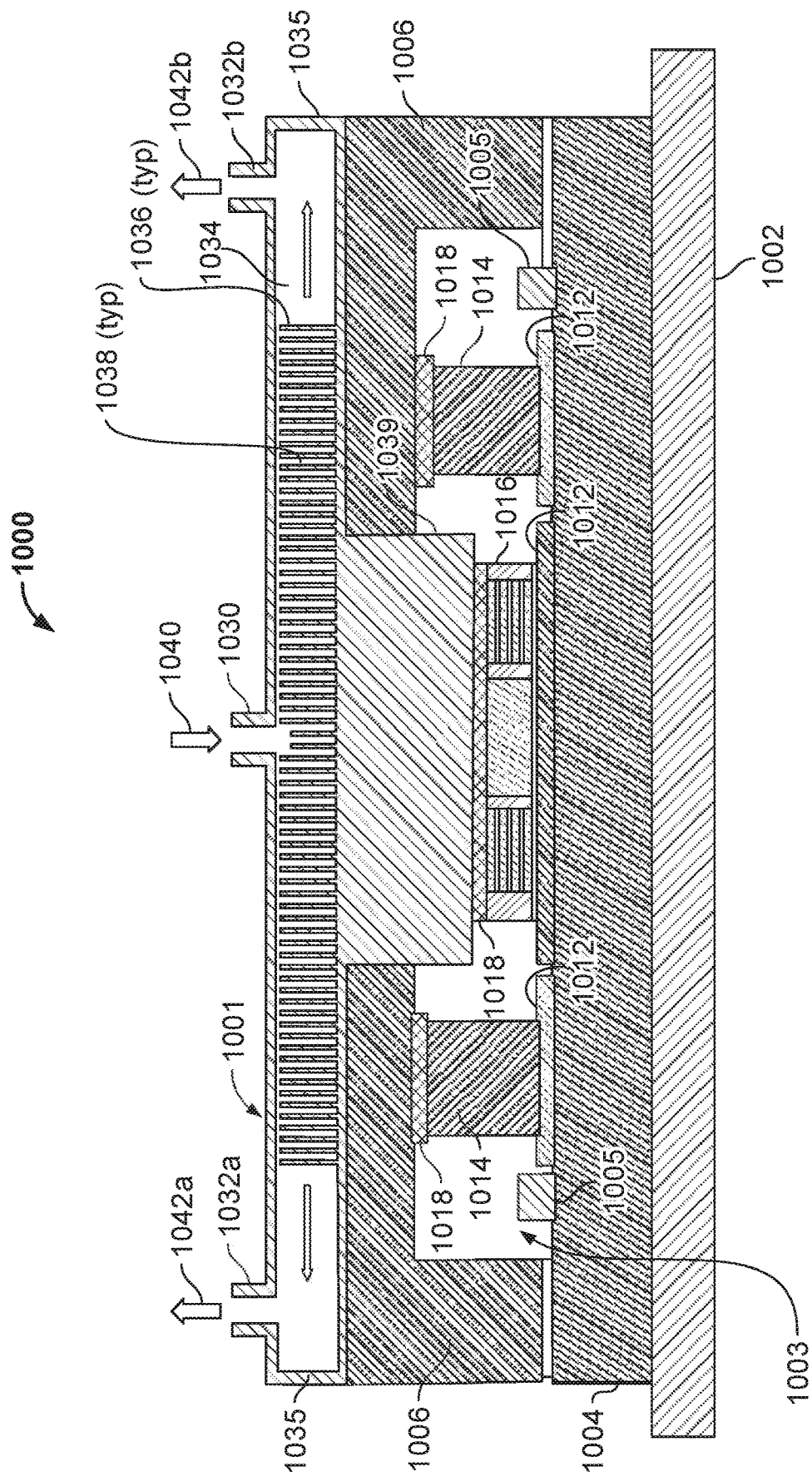
FIG. 10 illustrates a schematic cross-sectional side view of a portion of another example implementation of a server tray package that includes a liquid cold plate assembly set on a partial lid.

FIG. 10 illustrates a schematic cross-sectional side view of a portion of another example implementation of a server tray package 1000 that includes a liquid cold plate assembly 1001 set on a partial lid 1006. In some implementations, the server tray package 1000 may be used as one or more of the server rack sub-assemblies 110 shown in FIG. 1. Referring to FIG. 10, the server tray package 1000 includes a printed circuit board 1002, e.g., motherboard 1002, that supports one or more data center electronic devices; in this example, two or more voltage regulators 1014, two or more capacitors 1005, and one or more processing devices 1016 (e.g., one or more application-specific integrated circuits (ASIC)). In some aspects, the motherboard 1002 may be mounted on a frame (not shown), which can include or simply be a flat structure that can be grasped by technicians for moving the motherboard 1002 into place and holding it in position within the rack 105. For example, the server tray package 1000 may be mounted horizontally in the server rack 105 such as by sliding the frame into the slot 107 and over a pair of rails in the rack 105 on opposed sides of the server tray package 1000—much like sliding a lunch tray into a cafeteria rack. The frame can extend below the motherboard 1002 or can have other forms (e.g., by implementing it as a peripheral frame around the motherboard 1002) or may be eliminated so that the motherboard itself is located in, e.g., slidably engages, the rack 105. The frame can be a flat plate or include one or more side walls that project upwardly from the edges of the flat plate, and the flat plate could be the floor of a closed-top or open-top box or cage.

In some examples, one motherboard 1002 is mounted on a frame; alternatively, multiple motherboards 1002 may be mounted on a frame, depending on the needs of the particular application. In some implementations, the one or more fans (not shown) can be placed on the motherboard 1002 or a frame so that air enters at the front edge of the server tray package 1000, closer to the front of the rack 105 when the server tray package 1000 is installed in the rack 105, flows over the motherboard 1002, over some of the data center electronic components on the motherboard 1002, and is exhausted from the server tray package 1000 at the back edge, closer to the back of the rack 105 when the server tray package 1000 is installed in the rack 105. The one or more fans can be secured to the motherboard 1002 or a frame by brackets.

As illustrated, a substrate 1004 and one or more interposers 1012 (e.g., a silicon interposer) are positioned between the data center electronic devices 1005, 1014, and 1016 and the motherboard 1002. The substrate 1004, for example, provides an interface between one or more of the data center electronic devices (e.g., the processing device 1016) and the motherboard 1002, such as through pins that provide electrical and communication interfaces. The substrate 1004 also, in this example, may provide a mounting location for one or more components of the liquid cold plate assembly 1001. The interposer 1012, for example, provides a high bandwidth connection between the data center electronic devices, such as between the memory modules 1014 and the processing device 1016.

In the example of server tray package 1000, the data center electronic devices 1005, 1014, and 1016 may have different sizes and, more particularly, different heights. For instance, as shown, voltage regulators 1014 may be taller (e.g., 2 to 3 times taller), relatively, than the processor 1016 (and the capacitors 1005). Further, in some aspects, the data center electronic devices 1005, 1014, and 1016 may produce different heat outputs during their respective operations. For example, in some aspects, the processor 1016 may produce much more heat during operation (e.g., at least an order of magnitude more) than the voltage regulators 1014.

As shown in FIG. 10, the liquid cold plate assembly 1001 includes side portions 1035 and a base portion 1039. As shown, the side portions 1035 extend from the base portion 1039 and are thinner (e.g., shorter in vertical distance) than the base portion 1039. Although not shown, from a top view, the liquid cold plate assembly 1001 may be relatively square in shape, with the side portions 1035 being part of a perimeter area that circumscribes the base portion 1039.

The lid 1006, or partial lid 1006, sits on the substrate 1004 and includes an aperture through which the base portion 1039 may extend when the liquid cold plate assembly 1001 rests on the lid 1006. Although not shown, from a top view, the partial lid 1006 may be a square ring in shape, with the aperture shaped as a square to allow insertion of the base portion 1039 of the liquid cold plate assembly when the side portions 1035 rest on the partial lid 1006.

As shown, the partial lid 1006 defines or encloses a volume 1003 in which the interposer 1012 and the data center electronic devices 1005, 1014, and 1016 (mounted thereon) are positioned in the server tray package 1000. As shown in this example, a thermal interface material 1018 (e.g., a phase change material or otherwise thermally conductive material) is contactingly positioned between a bottom side of the partial lid 1006 and the data center electronic devices 1014 to provide a conductive heat transfer interface between these components.

In this example implementation, the side portions 1035 are mounted to a top surface of the partial lid 1006. When the side portions 1035 are mounted to the top of the partial lid 1006, the base 1039 (e.g., a bottom surface of the base 1039) is positioned in thermal contact with a top surface of processor 1016 through phase change material 1018 (or otherwise thermally conductive material) that provides a conductive heat transfer interface between a bottom the base portion 1039 and the processor 1016.

As shown in this example, the liquid cold plate assembly 1001 includes a cooling liquid inlet 1030 through which a supply 1040 of cooling liquid may enter, in this example, at a center location of the assembly 1001. The liquid cold plate assembly 1001 also includes cooling liquid outlets 1032*a* and 1032*b*, located at opposed edges of the side portions 1035, through which return 1042*a* and 1042*b* of cooling liquid may exit. A volume 1034 defines or includes a cooling liquid flow path between the inlet 1030 and the outlets 1032*a* and 1032*b*. As shown in this example, one or more heat transfer surfaces 1036 (e.g., fins, undulations, ridges, or other extended surfaces that increase a heat transfer area) are positioned in the volume 1034. In this example, the heat transfer surfaces 1036 extend from at or near a top interior surface of the assembly 1001 to at or near a top interior surface of the base portion 1039 of the assembly 1001. Thus, in this example, the volume 1034 (and the heat transfer surfaces 1036) has a substantially uniform height between the inlet 1030 and the outlets 1032*a* and 1032*b*. Further, as shown in this example, the heat transfer surfaces extend from at or near the inlet 1030 to at or near the outlets 1032*a* and 1032*b*.

The heat transfer surfaces 1036 define channels 1038, for example, through which the cooling liquid may be circulated to increase an amount of heat transferred from the data center electronic devices 1014 and 1016 to the cooling liquid (e.g., relative to an amount transferred in an implementation of the server tray package 1000 that does not include the heat transfer surfaces 1036). Alternative implementations of the server tray package 1000 may include multiple inlets 1030, multiple outlets 1032, or may not include the heat transfer surfaces 1036.

In an example operation of the server tray package 1000 to cool the data center electronic devices 1014 and 1016, the server tray package 1000 may be deployed, for example, in a data center server rack 105 in a data center. During operation of the server tray package 1000, the processing device 1016 and voltage regulators 1014 generate heat that may need to be dissipated or removed from the server tray package 1000 (e.g., for proper operation of the server tray package 1000). Heat generated by the processing device 1016 is transferred through the thermal interface material 1018 and to the base portion 1039 of the liquid cold plate assembly 1001. Heat generated by the voltage regulators 1014 is transferred through the thermal interface material 1018, through the partial lid 1006, and to the side portions 1035 of the liquid cold plate assembly 1001. In some examples, one or more components of the liquid cold plate assembly 1001 may be formed or made from a thermally conductive material, such as copper, aluminum, a combination of copper and aluminum, or other thermally conductive materials.

The heat transferred to the base portion 1039 and side portions 1035 of the liquid cold plate assembly 1001 is then transferred to the supply 1040 of the cooling liquid that is circulated through the inlet 1030 and into the volume 1034 of the liquid cold plate assembly 1001. In some examples, the cooling liquid may be a chilled water or glycol, such as from one or more chillers fluidly coupled to the server tray package 1000. In alternative examples, the cooling liquid may be a condenser water or other evaporatively-cooled liquid (e.g., without mechanical refrigeration). In other examples, the cooling liquid may be a dielectric single or two-phase fluid.

In any event, the cooling liquid supply 1040 may be at an appropriate temperature and flow rate to remove a desired amount of heat from the data center electronic devices 1014 and 1016.

In some examples, heat is transferred directly from the base portion 1039 to the cooling liquid supply 1040. Heat may also be transferred from the base portion 1039, through one or more heat transfer surfaces 1036 (in this example, extending across the volume 1034 between the inlet 1030 and outlets 1032*a* and 1032*b*), and then to the cooling liquid supply 1040 that flows through channels 1038. The heated cooling liquid supply 1040 is circulated to the outlets 1032*a* and 1032*b*, and exits the liquid cold plate assembly 1001 as the cooling liquid returns 1042*a* and 1042*b* (e.g., that is at a higher temperature than the cooling liquid supply 1040). The cooling liquid return 1042*a* and 1042*b* are circulated back, e.g., to a source of the cooling liquid, to expel the heat (e.g., in a chiller, cooling tower, or other heat exchanger) from the outlets 1032*a* and 1032*b*.

Figure 11:
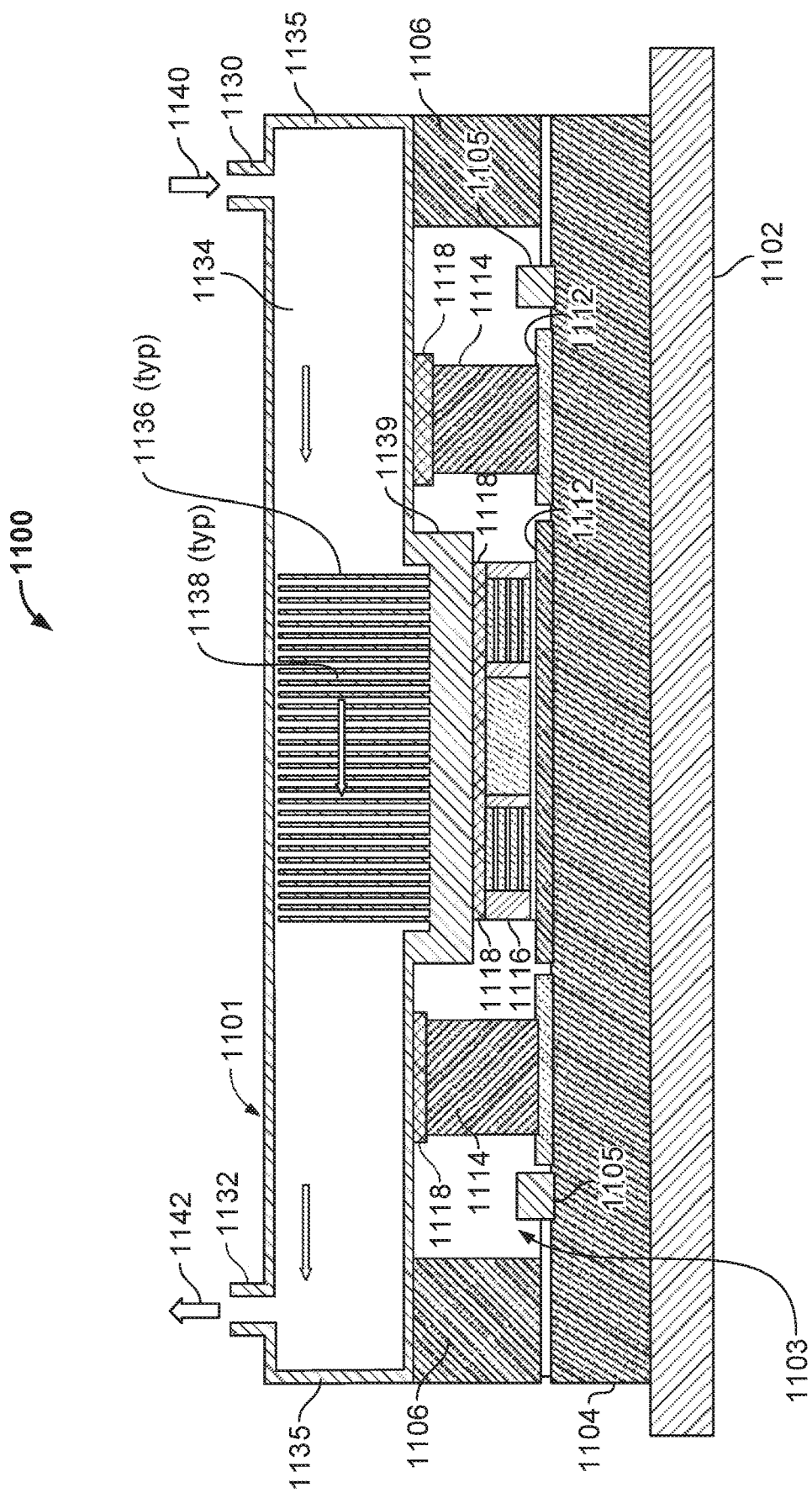
FIG. 11 illustrates a schematic cross-sectional side view of a portion of another example implementation of a server tray package that includes a liquid cold plate assembly set on a partial lid.

FIG. 11 illustrates a schematic cross-sectional side view of a portion of another example implementation of a server tray package 1100 that includes a liquid cold plate assembly 1101 set on a partial lid 1106. In some implementations, the server tray package 1100 may be used as one or more of the server rack sub-assemblies 110 shown in FIG. 1. Referring to FIG. 11, the server tray package 1100 includes a printed circuit board 1102, e.g., motherboard 1102, that supports one or more data center electronic devices; in this example, two or more voltage regulators 1114, two or more capacitors 1105, and one or more processing devices 1116 (e.g., one or more application-specific integrated circuits (ASIC)). In some aspects, the motherboard 1102 may be mounted on a frame (not shown), which can include or simply be a flat structure that can be grasped by technicians for moving the motherboard 1102 into place and holding it in position within the rack 105. For example, the server tray package 1100 may be mounted horizontally in the server rack 105 such as by sliding the frame into the slot 107 and over a pair of rails in the rack 105 on opposed sides of the server tray package 1100—much like sliding a lunch tray into a cafeteria rack. The frame can extend below the motherboard 1102 or can have other forms (e.g., by implementing it as a peripheral frame around the motherboard 1102) or may be eliminated so that the motherboard itself is located in, e.g., slidably engages, the rack 105. The frame can be a flat plate or include one or more side walls that project upwardly from the edges of the flat plate, and the flat plate could be the floor of a closed-top or open-top box or cage.

In some examples, one motherboard 1102 is mounted on a frame; alternatively, multiple motherboards 1102 may be mounted on a frame, depending on the needs of the particular application. In some implementations, the one or more fans (not shown) can be placed on the motherboard 1102 or a frame so that air enters at the front edge of the server tray package 1100, closer to the front of the rack 105 when the server tray package 1100 is installed in the rack 105, flows over the motherboard 1102, over some of the data center electronic components on the motherboard 1102, and is exhausted from the server tray package 1100 at the back edge, closer to the back of the rack 105 when the server tray package 1100 is installed in the rack 105. The one or more fans can be secured to the motherboard 1102 or a frame by brackets.

As illustrated, a substrate 1104 and one or more interposers 1112 (e.g., a silicon interposer) are positioned between the data center electronic devices 1105, 1114, and 1116 and the motherboard 1102. The substrate 1104, for example, provides an interface between one or more of the data center electronic devices (e.g., the processing device 1116) and the motherboard 1102, such as through pins that provide electrical and communication interfaces. The substrate 1104 also, in this example, may provide a mounting location for one or more components of the liquid cold plate assembly 1101. The interposer 1112, for example, provides a high bandwidth connection between the data center electronic devices, such as between the memory modules 1114 and the processing device 1116.

In the example of server tray package 1100, the data center electronic devices 1105, 1114, and 1116 may have different sizes and, more particularly, different heights. For instance, as shown, voltage regulators 1114 may be taller (e.g., 2 to 3 times taller), relatively, than the processor 1116 (and the capacitors 1105). Further, in some aspects, the data center electronic devices 1105, 1114, and 1116 may produce different heat outputs during their respective operations. For example, in some aspects, the processor 1116 may produce much more heat during operation (e.g., at least an order of magnitude more) than the voltage regulators 1114.

As shown in FIG. 11, the liquid cold plate assembly 1101 includes side portions 1135 and a base portion 1139. As shown, the side portions 1135 extend from the base portion 1139 and are thinner (e.g., shorter in vertical distance) than the base portion 1139. Although not shown, from a top view, the liquid cold plate assembly 1101 may be relatively square in shape, with the side portions 1135 being part of a perimeter area that circumscribes the base portion 1139.

The lid 1106, or partial lid 1106, sits on the substrate 1104 and defines an aperture through which the base portion 1139 may extend when the liquid cold plate assembly 1101 rests on the lid 1106. As shown in this example, the partial lid does not contact a top surface of the voltage regulators 1114 (e.g., through phase change material 1118), but instead, is shaped as a ring. Although not shown, from a top view, the partial lid 1106 may be a square ring in shape, with the aperture shaped as a square to allow insertion of the base portion 1139 of the liquid cold plate assembly when the side portions 1135 rest on the partial lid 1106.

As shown, the partial lid 1106 defines or encloses a volume 1103 in which the interposer 1112 and the data center electronic devices 1105, 1114, and 1116 (mounted thereon) are positioned in the server tray package 1100. As shown in this example, a thermal interface material 1118 (e.g., a phase change material or otherwise thermally conductive material) is contactingly positioned between a bottom side of the side portions 1135 and the voltage regulators 1114 to provide a conductive heat transfer interface between these components.

In this example implementation, the side portions 1135 are mounted to a top surface of the voltage regulators 1114. When the side portions 1135 are mounted to the top of the voltage regulators 1114, the base 1139 (e.g., a bottom surface of the base 1139) is positioned in thermal contact with a top surface of processor 1116 through phase change material 1118 (or otherwise thermally conductive material) that provides a conductive heat transfer interface between a bottom the base portion 1139 and the processor 1116.

As shown in this example, the liquid cold plate assembly 1101 includes a cooling liquid inlet 1130 through which a supply 1140 of cooling liquid may enter. The liquid cold plate assembly 1101 also includes a cooling liquid outlet 1132 through which a return 1142 of cooling liquid may exit. A volume 1134 defines or includes a cooling liquid flow path between the inlet 1130 and the outlet 1132. As shown in this example, one or more heat transfer surfaces 1136 (e.g., fins, undulations, ridges, or other extended surfaces that increase a heat transfer area) are positioned in the volume 1134. In this example, the heat transfer surfaces 1136 extend from at or near a top interior surface of the assembly 1101 to at or near a bottom interior surface of the base portion 1139 of the assembly 1101.

The heat transfer surfaces 1136 define channels 1138, for example, through which the cooling liquid may be circulated to increase an amount of heat transferred from the data center electronic devices 1114 and 1116 to the cooling liquid (e.g., relative to an amount transferred in an implementation of the server tray package 1100 that does not include the heat transfer surfaces 1136). Alternative implementations of the server tray package 1100 may include multiple inlets 1130, multiple outlets 1132, or may not include the heat transfer surfaces 1136.

In an example operation of the server tray package 1100 to cool the data center electronic devices 1114 and 1116, the server tray package 1100 may be deployed, for example, in a data center server rack 105 in a data center. During operation of the server tray package 1100, the processing device 1116 and voltage regulators 1114 generate heat that may need to be dissipated or removed from the server tray package 1100 (e.g., for proper operation of the server tray package 1100). Heat generated by the processing device 1116 is transferred through the thermal interface material 1118 and to the base portion 1139 of the liquid cold plate assembly 1101. Heat generated by the voltage regulators 1114 is transferred through the thermal interface material 1118 to the side portions 1135 of the liquid cold plate assembly 1101. In some examples, one or more components of the liquid cold plate assembly 1101 may be formed or made from a thermally conductive material, such as copper, aluminum, a combination of copper and aluminum, or other thermally conductive materials.

The heat transferred to the base portion 1139 and side portions 1135 of the liquid cold plate assembly 1101 is then transferred to the supply 1140 of the cooling liquid that is circulated through the inlet 1130 and into the volume 1134 of the liquid cold plate assembly 1101. In some examples, the cooling liquid may be a chilled water or glycol, such as from one or more chillers fluidly coupled to the server tray package 1100. In alternative examples, the cooling liquid may be a condenser water or other evaporatively-cooled liquid (e.g., without mechanical refrigeration). In other examples, the cooling liquid may be a dielectric single or two-phase fluid. In any event, the cooling liquid supply 1140 may be at an appropriate temperature and flow rate to remove a desired amount of heat from the data center electronic devices 1114 and 1116.

In some examples, heat is transferred directly from the base portion 1139 to the cooling liquid supply 1140. Heat may also be transferred from the base portion 1139, through one or more heat transfer surfaces 1136 (in this example, confined to the base portion 1139), and then to the cooling liquid supply 1140 that flows through channels 1138. The heated cooling liquid supply 1140 is circulated to the outlet 1132 and exits the liquid cold plate assembly 1101 as the cooling liquid return 1142 (e.g., that is at a higher temperature than the cooling liquid supply 1140). The cooling liquid return 1142 is circulated back, e.g., to a source of the cooling liquid, to expel the heat (e.g., in a chiller, cooling tower, or other heat exchanger) from the return 1142.

A number of embodiments have been described. Nevertheless, it will be understood that various modifications may be made without departing from the spirit and scope of what is described. For example, the steps of example operations of example methods and processes described herein may be performed in other orders, some steps may be removed, and other steps may be added. Accordingly, other embodiments are within the scope of the following claims.

What is claimed is:

1. A server tray package, comprising:
   a motherboard assembly that comprises a plurality of data center electronic devices, the plurality of data center electronic devices comprising at least one heat generating processor device;
   a liquid cold plate assembly that comprises:
   a base portion mounted to the motherboard assembly, the base portion and motherboard assembly defining a volume that at least partially encloses the plurality of data center electronic devices; and
   a top portion mounted to the base portion and comprising a heat transfer member that comprises an inlet port and an outlet port that are in fluid communication with a cooling liquid flow path defined through the heat transfer member; and
   a vapor chamber positioned between the base portion and the top portion, the vapor chamber comprising a housing that fluidly encloses a heat transfer fluid in thermal contact with the motherboard assembly and the liquid cold plate assembly, the heat transfer fluid comprising a vapor phase fluid in conductive thermal contact with the top portion of the liquid cold plate assembly and a liquid phase fluid in conductive thermal contact with the base portion of the liquid cold plate assembly, the vapor chamber comprising a plurality of fluidly independent sub-chambers, each sub-chamber formed and spaced within the housing without vertically overlapping the others of the plurality of fluidly independent sub-chambers, each of the fluidly independent sub-chambers fluidly isolated from the other of the plurality of fluidly independent sub-chambers, at least one of the fluidly independent sub-chambers comprising a first volume and at least another of the fluidly independent sub-chambers comprising a second volume greater than the first volume, each of the fluidly independent sub-chambers enclosing at least a portion of the heat transfer fluid, each of the fluidly independent sub-chambers positioned over a respective one of the plurality of data center electronic devices, with at least one of the first volume and the second volume determined based on a heat power output of the respective one of the plurality of data center electronic devices.

2. The server tray package of claim 1, further comprising:
   a first thermal interface material positioned between a bottom surface of the top portion and the vapor chamber; and
   a second thermal interface material positioned between a bottom surface of the base portion and at least a portion of the plurality of data center electronic devices; and
   a third thermal interface material positioned between a top surface of the base portion and the vapor chamber.

3. The server tray package of claim 1, wherein the liquid cold plate assembly further comprises a plurality of heat transfer surfaces enclosed within the cooling liquid flow path.

4. The server tray package of claim 1, wherein each of the fluidly independent sub-chambers comprises a floor and a ceiling, wherein the floors reside on a common first horizontal plane and the ceilings reside on a common second horizontal plane.

5. The server tray package of claim 1, wherein the portions of the heat transfer fluid vary in at least one of type or amount of heat transfer fluid based at least in part on one or more of the data center electronic devices in conductive thermal contact with the plurality of fluidly independent sub-chambers.

6. The server tray package of claim 1, wherein the vapor chamber further comprises a floor and a ceiling that overlay the at least one heat generating processor device, the vapor chamber comprising a uniform height between the floor and the ceiling across the vapor chamber.

7. The server tray package of claim 1, wherein the second volume is positioned in vertical alignment above the heat generating processor device.

8. The server tray package of claim 1, wherein the vapor chamber is integrally formed as a base of the top portion of the liquid cold plate assembly, and the vapor chamber is positioned on top of a cap of the base portion and in conductive heat transfer contact with the cap through a thermal interface material.

9. The server tray package of claim 1, wherein the vapor chamber is integrally formed as a cap of the base portion of the liquid cold plate assembly, and the vapor chamber supports a base of the top portion and is in conductive heat transfer contact with the base through a thermal interface material.

10. A method for cooling heat generating devices in a data center, comprising:
circulating a flow of a cooling liquid to a server tray package that comprises:
a motherboard assembly that comprises a plurality of data center electronic devices, the plurality of data center electronic devices comprising at least one heat generating processor device;
a liquid cold plate assembly that comprises a base portion mounted to the motherboard assembly, the base portion and motherboard assembly defining a volume that at least partially encloses the plurality of data center electronic devices, and a top portion mounted to the base portion; and
a vapor chamber positioned between the base portion and the top portion and comprising a plurality of fluidly independent sub-chambers formed and spaced within a housing of the vapor chamber without vertically overlapping the others of the plurality of fluidly independent sub-chambers;
circulating a flow of a cooling liquid into an inlet port of a heat transfer member of the top portion;
receiving heat from the plurality of data center electronic devices into a plurality of separated portions of a heat transfer fluid that are fluidly enclosed within the plurality of fluidly independent sub-chambers, each of the plurality of fluidly independent sub-chambers fluidly isolated from the other of the plurality of fluidly independent sub-chambers, at least one of the fluidly independent sub-chambers comprising a first volume and at least another of the fluidly independent sub-chambers comprising a second volume greater than the first volume, each of the fluidly independent sub-chambers positioned over a respective one of the plurality of data center electronic devices, with at least one of the first volume and the second volume determined based on a heat power output of the respective one of the plurality of data center electronic devices;
vaporizing a liquid phase of the heat transfer fluid that is in conductive thermal contact with the base portion of the liquid cold plate assembly with the heat transferred from the plurality of data center electronic devices;
condensing a vapor phase of the heat transfer fluid that is in conductive thermal contact with the top portion of the liquid cold plate assembly by transferring heat to the flow of the cooling liquid;
circulating the flow of the cooling liquid from the inlet port through a cooling liquid flow path defined through the heat transfer member to receive the transferred heat from the vapor phase of the heat transfer fluid into the cooling liquid; and
circulating the heated flow of the cooling liquid from the cooling liquid flow path to an outlet port of the heat transfer member.

11. The method of claim 10, further comprising:
transferring the heat from the plurality of data center electronic devices through a first thermal interface material positioned between the plurality of data center electronic devices and a bottom surface of the base portion;
transferring the heat from a top surface of the base portion through a second thermal interface material positioned between the base portion and the vapor chamber; and
transferring the heat from the vapor chamber through a third thermal interface material positioned between a bottom surface of the top portion of the liquid cold plate assembly and the vapor chamber.

12. The method of claim 10, wherein circulating the flow of the cooling liquid through the cooling liquid flow path defined through the heat transfer member comprises circulating the cooling liquid through a plurality of flow channels defined by a plurality of heat transfer surfaces enclosed within the cooling liquid flow path.

13. The method of claim 10, wherein
each of the plurality of fluidly independent sub-chambers comprises a floor and a ceiling, wherein the floors reside on a common first horizontal plane and the ceilings reside on a common second horizontal plane.

14. The method of claim 10, wherein the portions of the heat transfer fluid vary in at least one of type or amount of heat transfer fluid based at least in part on one or more of the data center electronic devices in conductive thermal contact with the plurality of fluidly independent chambers.

15. The method of claim 10, wherein the vapor chamber comprises a floor and a ceiling overlaying the at least one heat generating processor device, the vapor chamber comprising a uniform height between the floor and the ceiling across the vapor chamber.

16. The method of claim 10, further comprising:
receiving heat from the heat generating processor device into the portion of the heat transfer fluid enclosed within the second volume in the another of the fluidly independent sub-chambers; and
receiving heat from one or more memory devices into the portion of the heat transfer fluid enclosed within the first volume in the at least one of the fluidly independent sub-chambers.

17. The method of claim 10, wherein the vapor chamber is integrally formed as a base of the top portion of the liquid cold plate assembly, and the vapor chamber is positioned on top of a cap of the base portion and in conductive heat transfer contact with the cap through a thermal interface material.

18. The method of claim 10, wherein the vapor chamber is integrally formed as a cap of the base portion of the liquid cold plate assembly, and the vapor chamber supports a base of the top portion and is in conductive heat transfer contact with the base through a thermal interface material.

19. A method for forming a server tray package, comprising:

mounting a plurality of data center electronic devices to a motherboard assembly, the plurality of data center electronic devices comprising at least one heat generating processor device;

mounting a liquid cold plate assembly base to the motherboard assembly to at least partially define a volume that encloses the plurality of data center electronic devices;

mounting a vapor chamber to the liquid cold plate assembly base, the vapor chamber comprising a housing and a plurality of fluidly independent sub-chambers formed and spaced within the housing without vertically overlapping the others of the plurality of fluidly independent sub-chambers, each of the plurality of fluidly independent sub-chambers encloses at least a portion of a phase change fluid, at least two of the fluidly independent sub-chambers comprising volumes of different magnitudes, the volumes comprising a first volume and a second volume greater than the first volume, each of the plurality of fluidly independent sub-chambers fluidly separated from the others of the plurality of fluidly independent sub-chambers, each of the fluidly independent sub-chambers positioned over a respective one of the plurality of data center electronic devices, with at least one of the first volume and the second volume determined based on a heat power output of the respective one of the plurality of data center electronic devices; and mounting a liquid cold plate assembly top hat to the vapor chamber, the liquid cold plate assembly top hat comprising a heat transfer member that comprises an inlet port and an outlet port that are in fluid communication with a cooling liquid flow path defined through the heat transfer member, wherein the portions of the phase change fluid in the plurality of fluidly independent chambers are sealingly isolated from the cooling liquid flow path defined through the heat transfer member.

20. The method of claim 19, further comprising:

mounting the plurality of data center electronic devices to an interposer of the motherboard assembly;

mounting the interposer to a substrate of the motherboard assembly; and mounting the substrate to a motherboard of the motherboard assembly.

21. The method of claim 20, further comprising:

positioning a first thermal interface material between a lid of the liquid cold plate assembly base and the vapor chamber;

positioning a second thermal interface material between the lid and the plurality of data center electronic devices; and positioning a third thermal interface material between the vapor chamber and a base of the liquid cold plate assembly top hat.

22. The method of claim 20, wherein the vapor chamber comprises a base of the liquid cold plate assembly top hat.

23. The method of claim 20, wherein the vapor chamber comprises a lid of the liquid cold plate assembly base.

24. The method of claim 20, wherein an area of a bottom surface of the housing of the vapor chamber is different than an area of the liquid cold plate assembly base upon which the vapor chamber is mounted.

* * * * *